United States Patent
Ang et al.

(10) Patent No.: US 6,278,306 B1
(45) Date of Patent: Aug. 21, 2001

(54) METHOD FOR AN OUTPUT DRIVER WITH IMPROVED SLEW RATE CONTROL

(75) Inventors: Michael A. Ang, Santa Clara; Alexander D. Taylor; Jonathan E. Starr, both of Cupertino; Sai V. Vishwanthaiah, Sunnyvale, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/327,057

(22) Filed: Jun. 7, 1999

(51) Int. Cl.⁷ ...................................... H03K 5/12
(52) U.S. Cl. .......................... 327/170; 327/108; 326/82; 326/87
(58) Field of Search .................................. 327/102, 108, 327/112, 138, 170, 175; 326/27, 82, 83, 81, 87

(56) References Cited

U.S. PATENT DOCUMENTS

| | | | |
|---|---|---|---|
| 4,694,205 | 9/1987 | Shu et al. | 327/57 |
| 4,707,620 | 11/1987 | Sullivan et al. | 326/86 |
| 4,719,369 | 1/1988 | Asano et al. | 326/20 |
| 4,743,784 | 5/1988 | Obara et al. | 327/57 |
| 4,804,871 | 2/1989 | Walters, Jr. | 327/54 |
| 4,831,287 | 5/1989 | Golab | 327/55 |
| 4,845,675 | 7/1989 | Krenik et al. | 365/203 |
| 4,855,628 | 8/1989 | Jun | 327/57 |
| 4,859,877 | 8/1989 | Cooperman et al. | 326/20 |
| 4,931,675 | 6/1990 | Iwata | 327/57 |
| 4,937,479 | 6/1990 | Hoshi | 327/57 |
| 4,959,563 | 9/1990 | Schenck | 320/27 |
| 5,086,271 | 2/1992 | Haill et al. | 324/158 |
| 5,134,311 | 7/1992 | Biber et al. | 327/86 |
| 5,138,515 * | 8/1992 | Bourgeois | 323/289 |
| 5,162,672 | 11/1992 | McMahan et al. | 326/20 |
| 5,194,765 | 3/1993 | Dunlop et al. | 326/20 |
| 5,231,311 | 7/1993 | Ferry et al. | 326/27 |
| 5,371,320 | 12/1994 | Nakao | 326/27 |
| 5,402,425 * | 3/1995 | Bladh | 331/17 |
| 5,457,407 | 10/1995 | Shu et al. | 326/30 |
| 5,568,081 * | 10/1996 | Lui et al. | 327/170 |
| 5,598,107 * | 1/1997 | Cabuk | 326/27 |
| 5,602,494 | 2/1997 | Sundstrom | 326/30 |
| 5,615,161 | 3/1997 | Mu | 365/208 |
| 5,623,216 * | 4/1997 | Penza et al. | 326/27 |
| 5,644,252 | 7/1997 | Watarai | 326/27 |
| 5,666,078 | 9/1997 | Lamphier et al. | 327/108 |
| 5,726,583 | 3/1998 | Kaplinsky | 326/30 |
| 5,739,707 | 4/1998 | Barraclough | 327/112 |
| 5,774,403 | 6/1998 | Clark, II et al. | 365/194 |
| 5,838,177 | 11/1998 | Keeth | 327/108 |
| 5,850,159 * | 12/1998 | Chow et al. | 327/170 |
| 5,852,579 | 12/1998 | Arcoleo et al. | 365/189.5 |
| 5,862,390 | 1/1999 | Ranjan | 395/750.01 |
| 5,877,647 * | 3/1999 | Vajapey et al. | 327/170 |
| 5,898,321 * | 4/1999 | Ilkbahar et al. | 327/170 |

(List continued on next page.)

Primary Examiner—Timothy P. Callahan
Assistant Examiner—An T. Luu
(74) Attorney, Agent, or Firm—Skjerven Morrill MacPherson LLP; Stephen A. Terrile; Margaret M. Kelton

(57) ABSTRACT

A method for a driver may be provided which controls the output slew rate of a driver which includes within the driver an impedance control and a slew rate circuit. Accordingly, a desired output slew rate and a desired output impedance can be advantageously established and maintained over a wide range of variations in operating conditions, manufacturing processes and output voltage levels. Such a method also advantageously limits any crowbar current, thereby reducing the overall power consumption of the driver with little, if any, degradation of driver performance.

33 Claims, 9 Drawing Sheets

U.S. PATENT DOCUMENTS

| | | | |
|---|---|---|---|
| 5,929,671 | * 7/1999 | Best | 327/131 |
| 6,026,456 | 2/2000 | Ilkbahar | 710/101 |
| 6,047,346 | 4/2000 | Lau et al. | 710/126 |
| 6,060,907 | 5/2000 | Vishwanthaiah et al. | 326/87 |
| 6,085,033 | 7/2000 | Starr et al. | 395/500.15 |
| 6,118,310 | 9/2000 | Esch, Jr. et al. | 327/108 |

* cited by examiner

METHOD FOR AN OUTPUT DRIVER WITH IMPROVED SLEW RATE CONTROL

CROSS-REFERENCE TO RELATED APPLICATIONS

This application relates to co-pending U.S. patent application Ser. No. 09/326,964, filed on Jun 7, 1999, entitled Output Driver with Improved Impedance Control and naming Michael A. Ang, Alexander D. Taylor, Jonathan E. Starr, and Sai V. Vishwanthaiah as inventors, the application being incorporated herein by reference in its entirety.

This application relates to co-pending U.S. patent application Ser. No. 09/327,220, filed on Jun. 7, 1999, entitled Method for an Output Driver with an Improved Impedance Control and naming Michael A. Ang, Alexander D. Taylor, Jonathan E. Starr, and Sai V. Vishwanthaiah as inventors, the application being incorporated herein by reference in its entirety.

This application relates to co-pending U.S. patent application Ser. No. 09/326,909, filed on Jun. 7, 1999, entitled Output Driver with Improved Slew Rate Control and naming Michael A. Ang, Alexander D. Taylor, Jonathan E. Starr, and Sai V. Vishwanthaiah as inventors, the application being incorporated herein by reference in its entirety.

BACKGROUND OF THE INVENTION

1. Field of the Invention

The present invention relates to driver circuits and more particularly to driver circuits for use in information processing systems.

2. Description of the Related Art

In computer and information processing systems, various integrated circuit chips must communicate digitally with each other over common buses. The signal frequency at which this communication occurs can limit the performance of the overall system. Thus, the higher the communication frequency, the better. The maximum frequency at which a system communicates is a function not only of the time that it takes for the electromagnetic wavefronts to propagate on the bus from one chip to another, but also of the time required for the signals to settle to levels that can be reliably recognized at the receiving bus nodes as being HIGH or LOW, referred to as the settling time.

There are several factors which affect the settling time of a signal. For example, the "slew rate" of the launched signal, i.e., the rate at which the voltage level of the launched signal changes from one level to another, is one factor which affects the settling time of the signal. The oscillations in the voltage level of the signal (i.e., the "ringing") due to the effects of package inductance, pad capacitance and other "parasitics" is another factor which affects the settling time of the signal. Ringing due to reflections from impedance mismatches within the bus system is another factor which affects the settling time of the signal. The voltage level of the launched signal relative to the overall signal swing (i.e., the difference between high and low voltage levels of the signal) is another factor which affects the settling time of the signal. The effectiveness of the termination of the bus is another factor which affects the settling time of the signal.

The operating characteristics of transistors such as CMOS transistors, from which drivers are typically constructed, change under a variety of conditions, often referred to as process, voltage, temperature (PVT) variations. PVT variations may be conceptualized as a box across which the operating characteristics of the transistors move. For example, the operating characteristics may move from a fastest corner of PVT variations to a slowest corner of PVT variations, and everywhere in between. More specifically, the operating characteristics due to PVT variations may change with variations in manufacturing process as well as with variations in operating conditions such as junction temperature and supply voltage levels. The operating characteristics may also change with variations of voltage differences across the transistor terminals of the driver; the voltage differences may change as the voltage level at the output node of the driver changes.

If inadequate compensation is made for these variations, the output slew rate and output impedance of the driver may vary substantially within a particular driver as well as from driver to driver on a chip.

Another characteristic that is desirable to control within a driver is crowbar current. The crowbar current is the current that flows directly between the supply rails of a driver through the pull up and pull down units of a driver if both units are enabled simultaneously. Having high crowbar current may cause the driver to consume more power than necessary to provide adequate driver performance.

It is known to provide drivers having different termination characteristics. For example, a High Speed Transceiver Logic (HSTL) driver, may be designed to terminate at the driver end of a transmission line; a Dynamic Termination Logic (DTL) driver may be designed to terminate at the receiver end of a transition. Each of these driver types has characteristics that affect when a particular type is chosen for a design.

SUMMARY OF THE INVENTION

It has been discovered that a method for a driver may be provided that controls the output slew rate of a driver by including within the driver a compensation circuit which includes an impedance circuit and a slew rate control. Accordingly, a desired output slew rate and a desired output impedance can be advantageously established and maintained over a wide range of variations in operating conditions, manufacturing processes, supply voltage levels, and output voltage levels. Such a driver also advantageously limits any crowbar current thereby reducing the overall power consumption of the driver with little, if any, degradation of driver performance.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Overview

Figure 1:
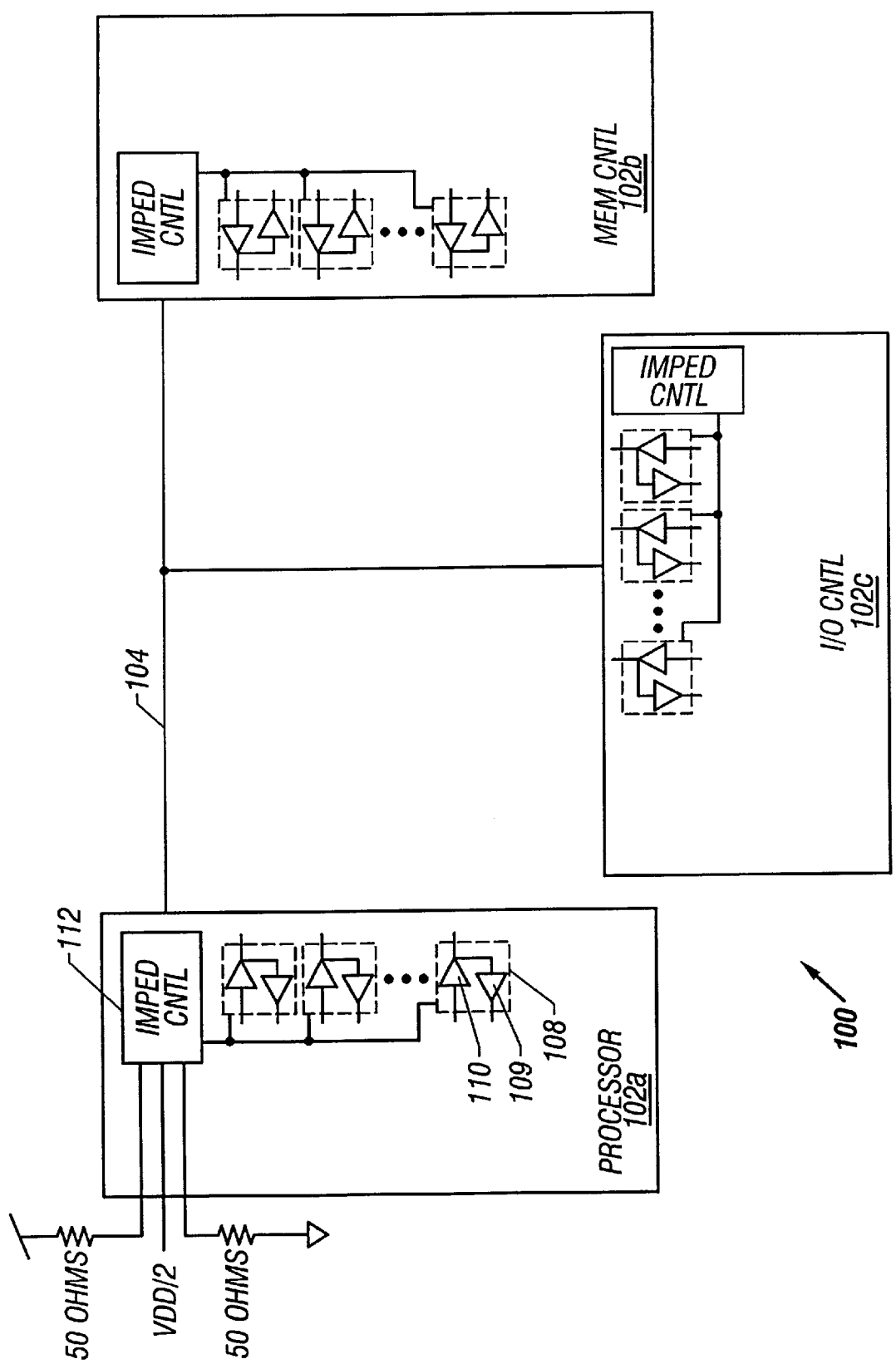
FIG. 1 shows a block diagram of an information handling system having a driver circuit in accordance with the present invention.

Referring to FIG. 1, information handling system 100 includes a plurality of components 102 such as processor 102a, memory controller 102b, and I/O controller 102c. It will be appreciated that these components 102 may be any type of component commonly found in an information handling system. Each of these components 102 is generally configured as an individual integrated circuit chip. However, it is known to combine various components into a single integrated circuit chip. Components 102 are coupled via bus 104. Bus 104 includes a plurality of parallel lines which are coupled to individual signal outputs of each of the components 102.

Each component 102 includes a plurality of circuits 108, including input/output circuits and may include output only circuits. The plurality of circuits 108 are coupled to individual signal paths of bus 104. Each circuit 108 may include a receiver circuit 109 and a driver circuit 110. Component 102 also includes impedance control circuit 112 which may be coupled to each driver circuit 110. Impedance control circuit 112 controls the output impedance of each driver and is appropriate for bus systems that are terminated at the source only and are "open-circuited" at the destination nodes.

In addition to the impedance control circuit 112, as more fully described below, circuitry in the driver circuits 110, including a pull up circuit and a pull down circuit, maintain control over the operating characteristics including output slew rate as well as crowbar current.

In operation, in driver circuits 110, control can be exercised over certain operating characteristics such as output impedance, output slew rate, and "crowbar" current. It is possible to control the output impedance of the driver circuits 110 even though the operating conditions of the transistors inside the driver circuits 110 vary with the manufacturing process, supply voltage, and temperature (PVT) and with changes in the voltages across the terminals of the transistors voltage levels.

Structure

FIGS. 2–5 and 7–9 describe the basic structural components of the driver circuit 110, including both the pull up circuit 202 and the pull down circuit 204. The functionality of the individual component parts are described in fuller detail below.

Figure 2:
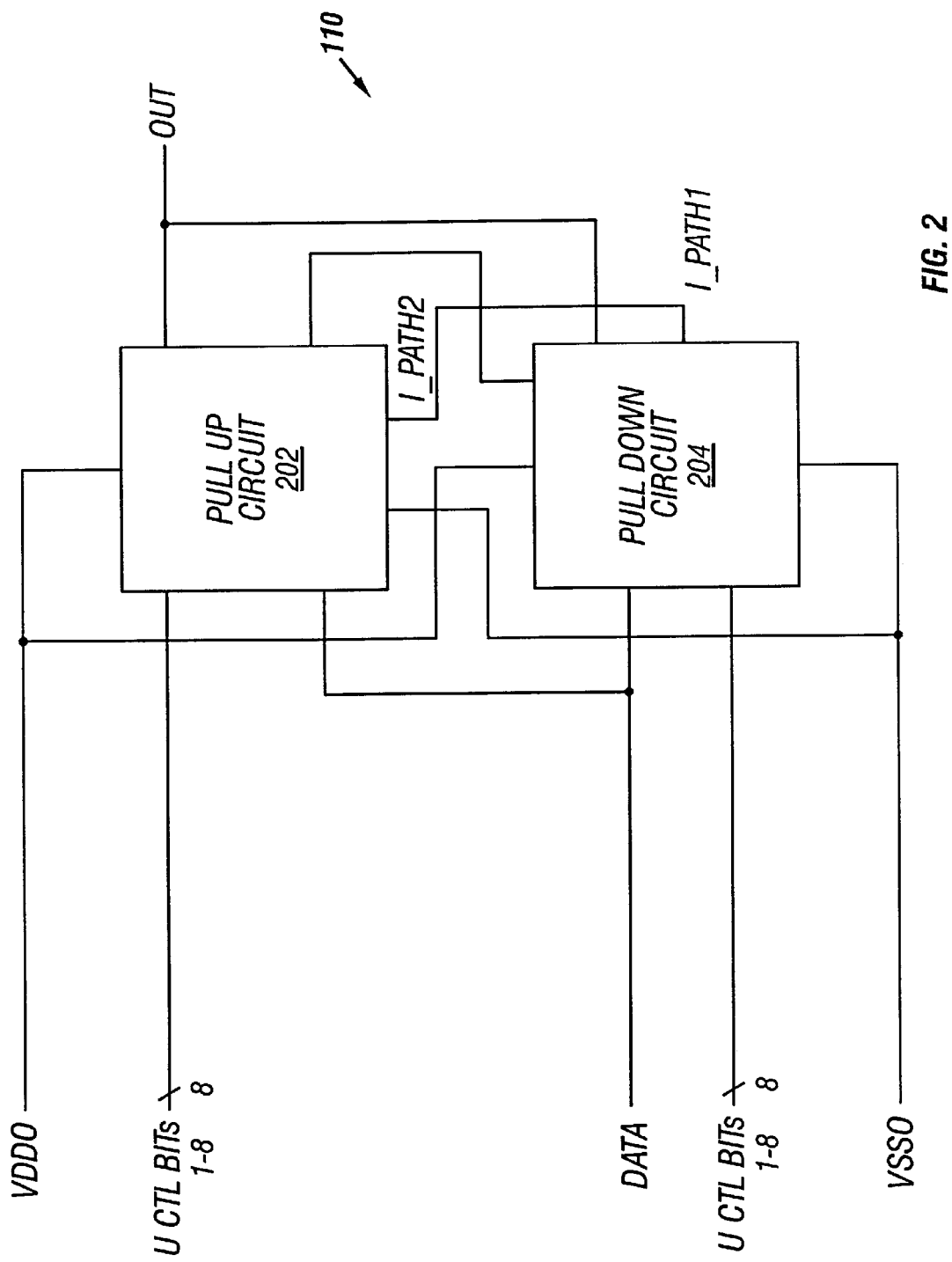
FIG. 2 shows a block diagram of the driver circuit in accordance with the present invention.

Referring to FIG. 2, driver circuit 110 includes pull up circuit 202 and a pull down circuit 204. Each of the pull up circuit 202 and the pull down circuit 204 of driver circuit 110 receives a high voltage input supply (VDDO) and a low voltage supply (VSSO). Pull up circuit 202 receives a set of control signals (U CTL BITs 1–8) which are provided by impedance control circuit 112 (see FIG. 1) to pull up circuit 202. Pull down circuit 204 receives a set of control signals (D CTL BITs 1–8) which are provided by impedance control circuit 112 and to pull down circuit 204. Each circuit of pull down circuit 204 and pull up circuit 202 receives the high voltage input supply (VDDO) and the low voltage input supply (VSSO).

Pull up circuit 202 also receives a DATA signal as well as a slew rate control current path from pull down circuit 204 (I_PATH2). Pull up circuit 202 provides a pull up slew rate control current path to pull down circuit 204 (I_PATH1) and a driver output signal (OUT) which is provided to bus 104 (see FIG. 1).

Pull down circuit 204 also receives a DATA signal and a slew rate control current path from pull up circuit 202 (I_PATH1). Pull down circuit 204 provides a pull down slew rate control current path to pull up circuit 202 (I_PATH2) and a driver output signal (OUT), which is provided to bus 104 (see FIG. 1). The driver output signals provided by pull up circuit 202 and pull down circuit 204 are coupled together prior to being provided to bus 104. However, generally only one of pull up circuit 202, pull down circuit 204, or neither circuit, drives a signal onto bus 104 at any given time.

Although not shown, it will be appreciated that other embodiments of the present invention include providing additional signals input and output from both the pull up circuit 202 and pull down circuit 204. Such signals may include and are not limited to a clock signal, an inverted data signal, an output enable signal, a scan input signal and a select data signal which may be provided externally of driver circuit 110.

Figure 3:
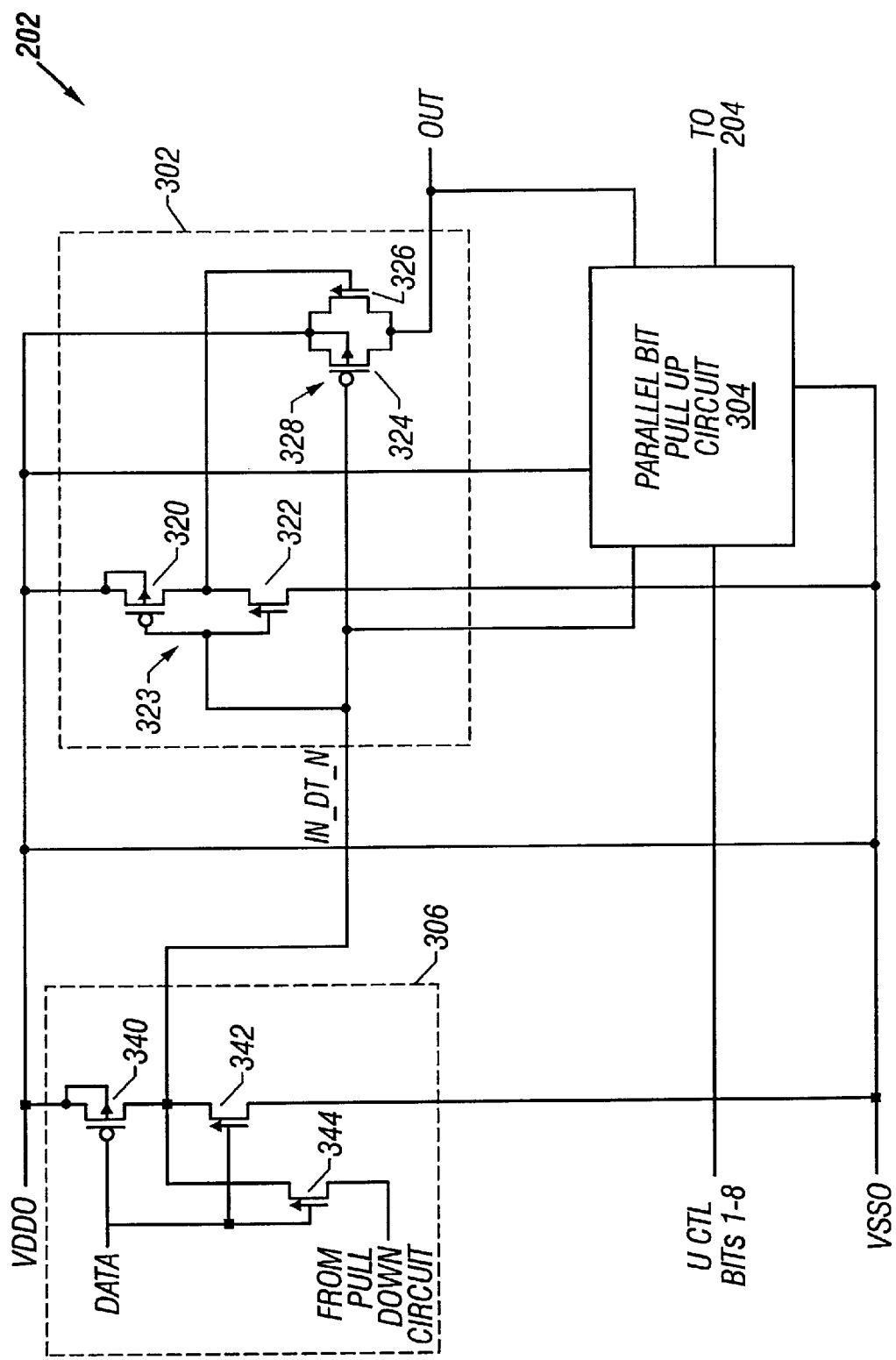
FIG. 3 shows a block diagram of a pull up circuit for the driver circuit of FIG. 2.

Referring to FIG. 3, pull up circuit 202 includes base bit circuit 302, parallel bit pull up circuit 304 and pull up control circuit 306. Each circuit of pull up circuit 202 receives the high voltage input supply (VDDO) and the low voltage input supply (VSSO). Pull up control circuit 306 includes NMOS transistors 344 and 342 and PFET transistor 340. Base bit circuit 302 includes PFET transistor 320 and NMOS transistor 322, together inverter 323, and NMOS transistor 326 and PFET transistor 326, together output element 328.

Figure 4:
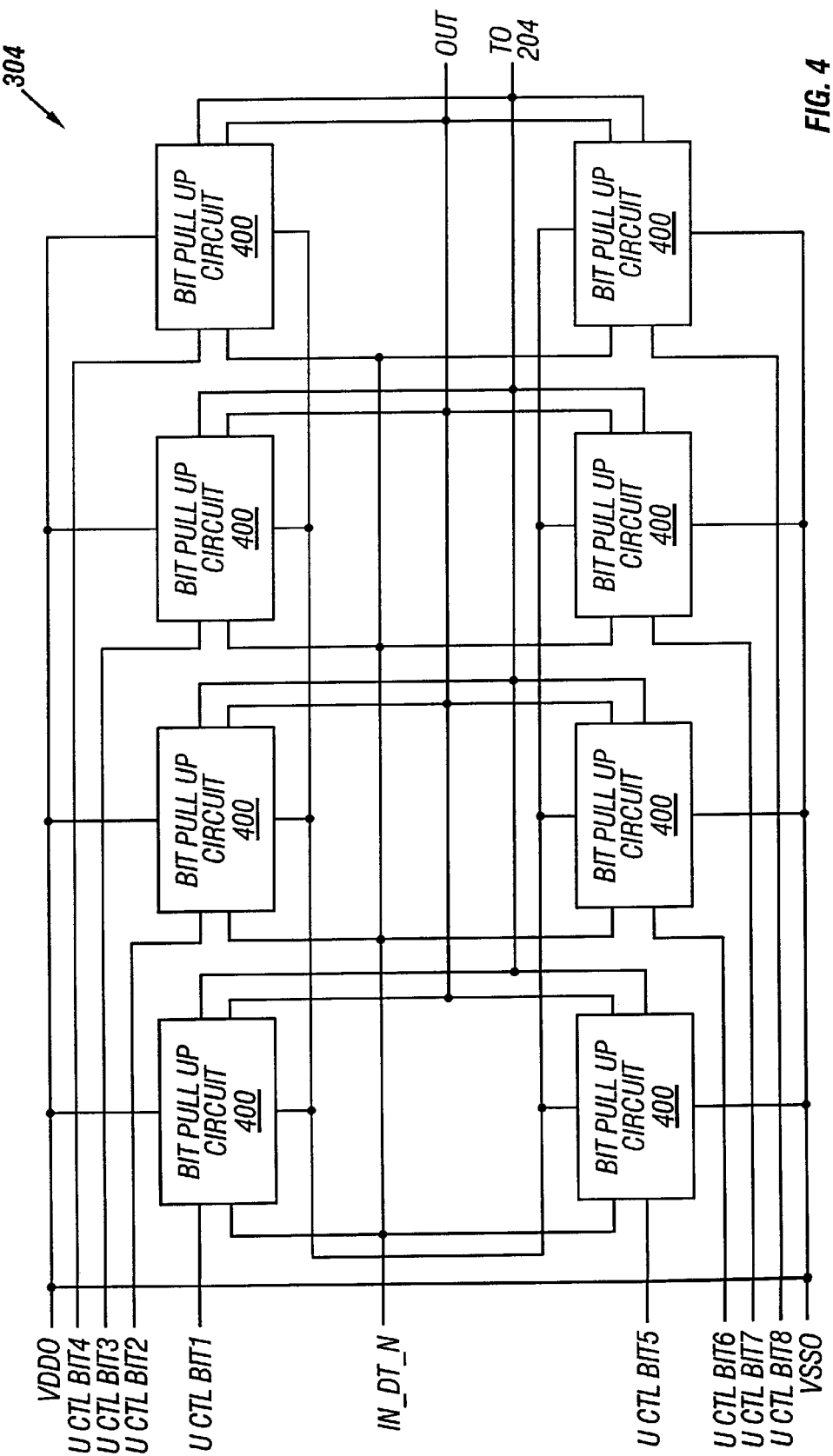
FIG. 4 shows a schematic block diagram of a parallel bit pull up circuit of the pull up circuit of FIG. 3.

Referring to FIG. 4, parallel bit pull up circuit 304 shown in FIG. 3 is shown in further detail. FIG. 4 shows a plurality of bit pull up circuits 400 connected in parallel and connected to U CTL BITs 1–8 as well as to the IN_DT_N signal. Additionally, the plurality of bit pull up circuits 400 are also connected to the output OUT and to "TO 204". TO 204 represents a slew rate control current path.

Figure 5:
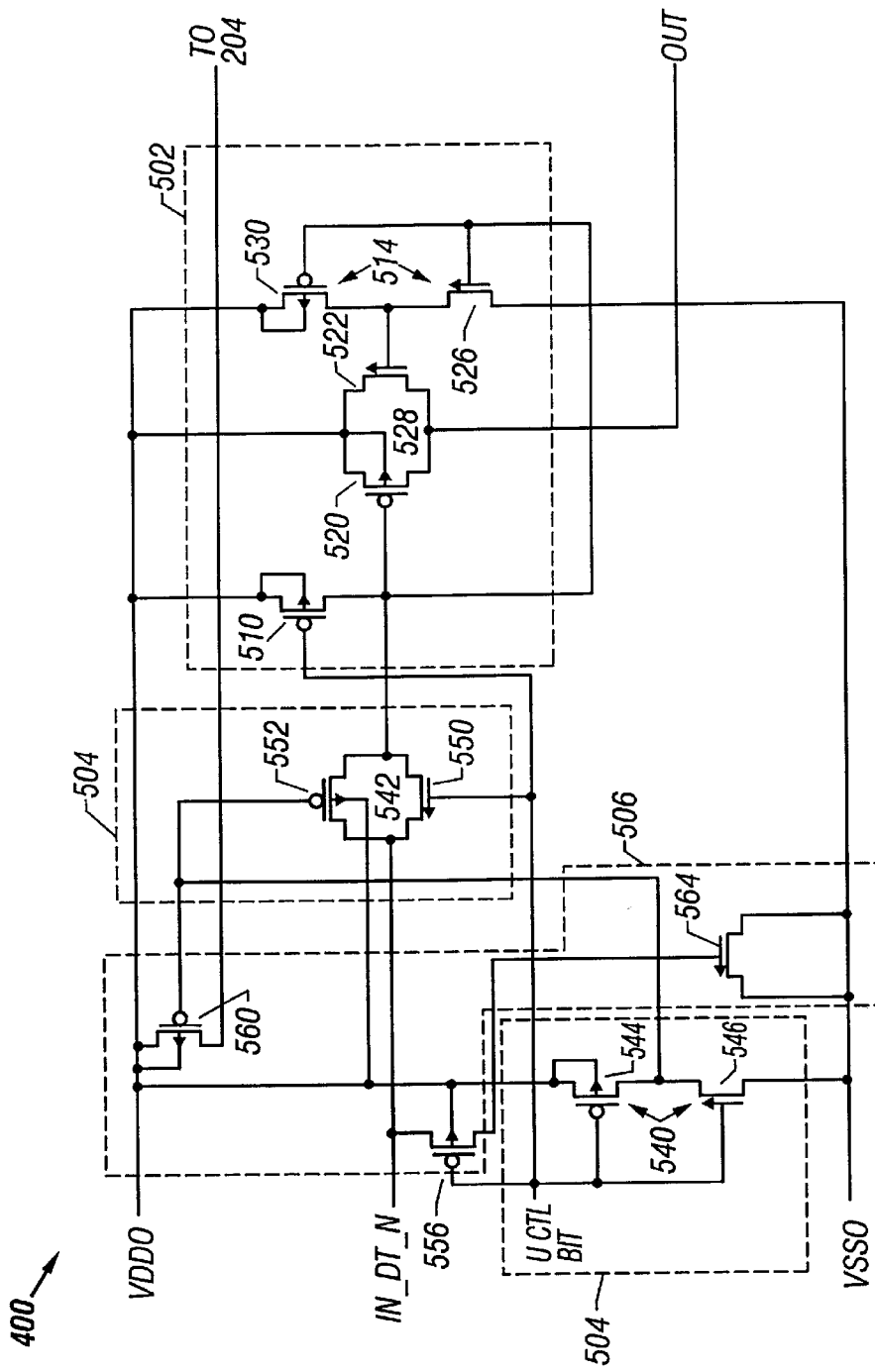
FIG. 5 shows a schematic block diagram of a generic pull up bit circuit of the parallel bit pull up circuit of FIG. 4.

Referring to FIG. 5, one of the plurality of bit pull up circuits 400 is shown in further detail. FIG. 5 shows bit driver circuit 502, bit control circuit 504 and slew rate control circuit 506. Bit driver circuit 502 includes pull up PFET transistor 510 as well as pull up output element 528 and inverter 514. Pull up output element 528 includes PFET transistor 520 and NMOS transistor 522. Inverter 514 includes NMOS transistor 526 and PFET transistor 530. Pull up PFET transistor 510 is coupled between the U CTL BIT signal, the gate of PFET transistor 520, the gates of the inverter 514 transistors, the output of transmission gate 542, and the voltage supply VDDO. The gate of pull up transistor 510 is connected to the bit control signal which is provided by bit control circuit 504. Bit control circuit 504 includes inverter 540 and transmission gate 542. Inverter 540 includes PFET transistor 544 and NMOS transistor 546. Transmission gate 542 includes NMOS transistor 550 and PFET transistor 552. Slew rate control circuit 506 includes PFET transistor 556, PFET transistor 560 and NMOS transistor 564.

Figure 6A:
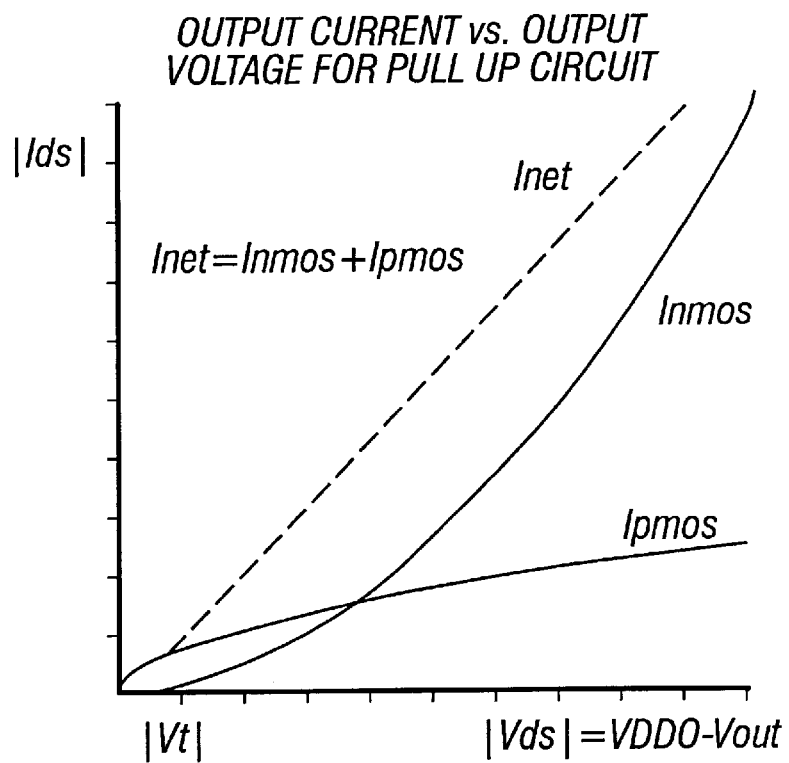
FIG. 6A shows a graph of the Output Current vs. Output Voltage for the pull up circuit of FIG. 3.
Figure 6B:
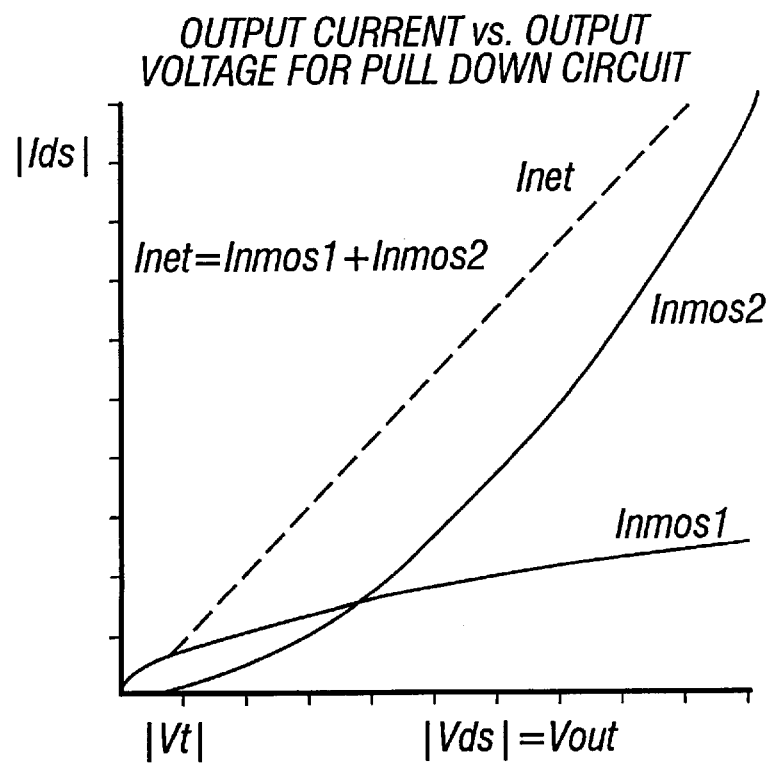
FIG. 6B shows a graph of the Output Current vs. Output Voltage for the pull down circuit of FIG. 7.

FIGS. 6A and 6B provide plots of the output current versus output voltage for both the pull down and pull up circuits. The FIGS. 6A and 6B are discussed in further detail below.

Figure 7:
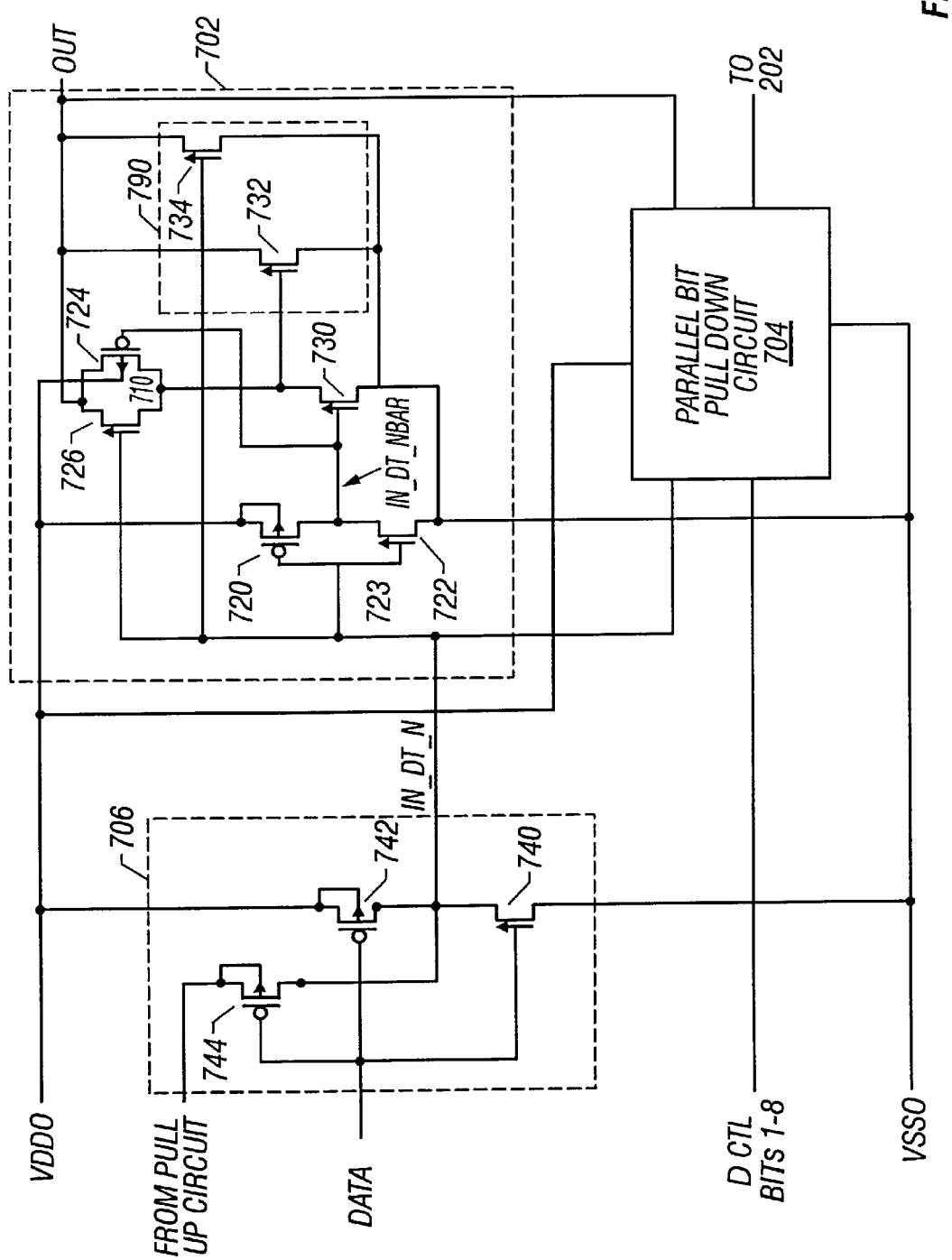
FIG. 7 shows a block diagram of a pull down circuit for the driver circuit of FIG. 2.
Figure 8:
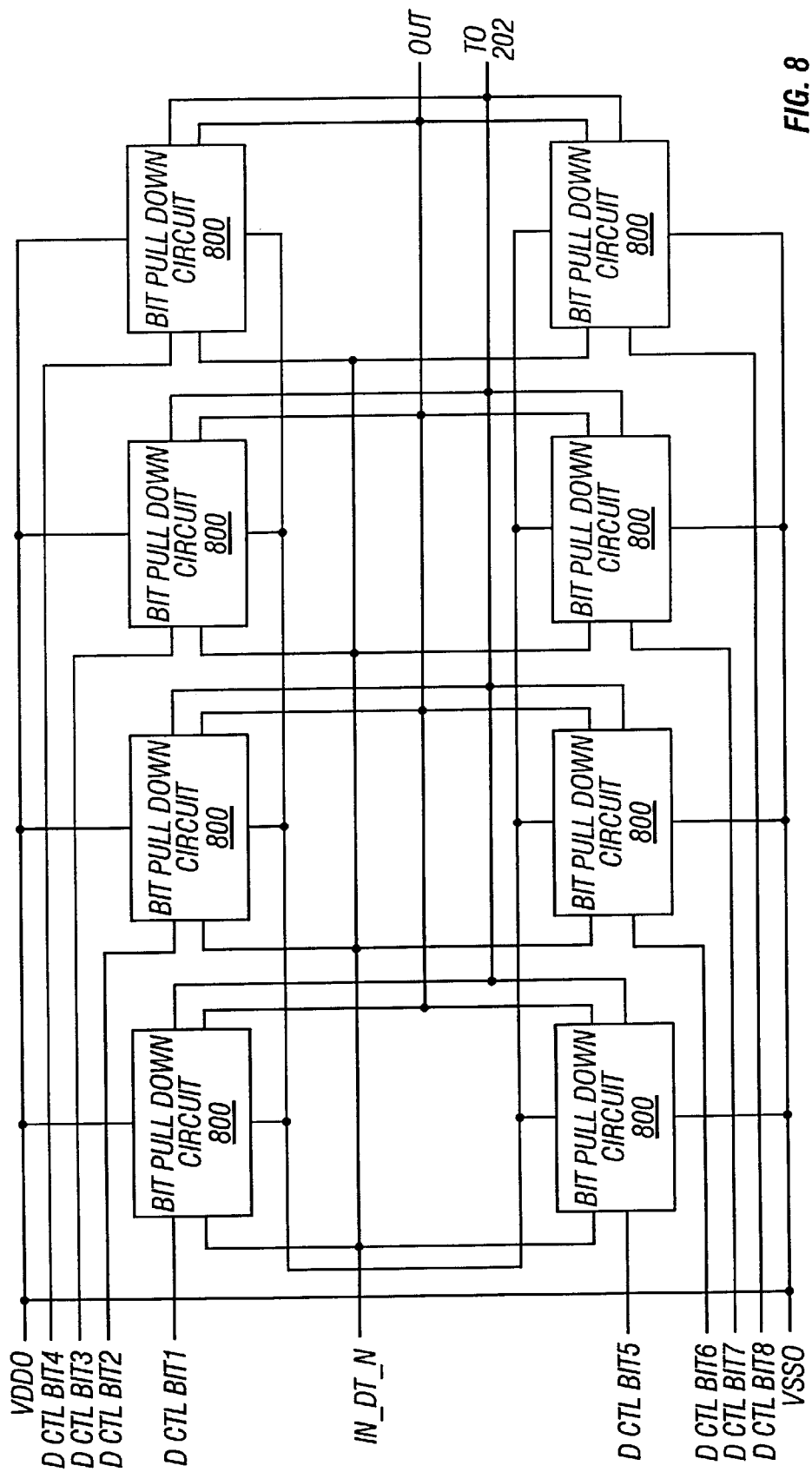
FIG. 8 shows a schematic block diagram of a parallel bit pull down circuit of the pull up circuit of FIG. 7.
Figure 9:
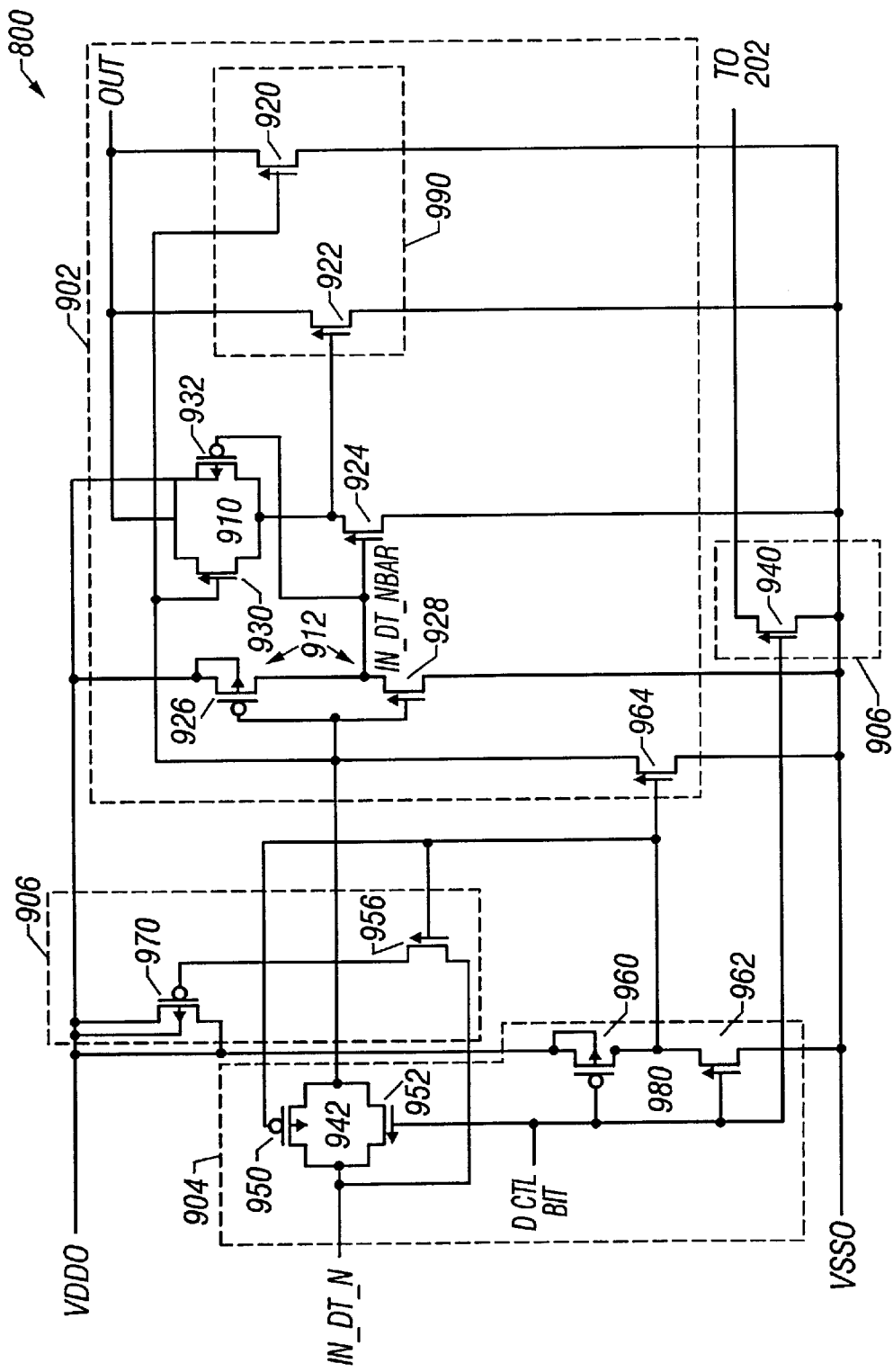
FIG. 9 shows a schematic block diagram of a generic pull down bit circuit of the parallel bit pull down circuit of FIG. 8.

FIGS. 7, 8 and 9 represent the pull down versions of FIGS. 3, 4 and 5.

Referring to FIG. 7, pull down circuit 204 includes base bit output circuit 702, parallel bit pull down circuit 704 and pull down control circuit 706. Pull down control circuit 706 includes PFET transistors 742 and 744 and NMOS transistor 740. Pull down base bit circuit 702 includes PFET transistor 720 and NMOS transistor 722, which together provide an inverter 723, and NMOS transistor 730. Other components in pull down base bit circuit 702 include PFET transistor 724 and NMOS transistor 726, which are connected to provide a transmission gate 710. Pull down base bit output circuit 702 also includes NMOS transistor 732 and NMOS transistor 734, together the base bit output element 790.

Referring to FIG. 8, parallel bit pull down circuit 704 is shown in further detail. FIG. 8 shows a plurality of bit pull down circuits 800 connected in parallel and connected to the IN_DT_N signal as well as the D CTL BITs 1–8. Additionally, the plurality of bit pull down circuits 800 are also connected to the output OUT and to "TO 202". TO 202 represents a slew rate current path.

Referring to FIG. 9, one of the plurality of bit pull down circuits 800 is shown in fiurther detail. Bit pull down circuit 800 includes bit control circuit 904, slew rate control circuit 906, and bit driver circuit 902, which includes output element 990.

More specifically, bit driver circuit 902 includes bit control circuit 904 and slew rate control circuit 906, transmission gate 910, output element 990, inverter 912, NMOS transistor 924 and NMOS transistor 964. Transmission gate 910 includes NMOS transistor 930 and PFET transistor 932. Inverter 912 includes PFET transistor 926 and NMOS transistor 928. Output element 990 includes pull down NMOS transistor 922, and pull down NMOS transistor 920. Bit control circuit 904 includes inverter 980 and transmission gate 942. Inverter 980 includes PFET transistor 960 and NMOS transistor 962. Transmission gate 942 includes PFET transistor 950 and NMOS transistor 952. Slew rate control circuit 906 includes NMOS transistor 956, PFET transistor 970 and NMOS transistor 940.

Control of Output Impedance

Pull up circuit 202 controls the pull up impedance of driver 110 across PVT variations by responding to an "impedance-control code" received by the pull up circuit by outside circuitry described in U.S. patent application Ser. No. 08/881,939, hereby incorporated by reference. It is understood, however, that the impedance control signals alternatively come from other sources.

Referring back to FIG. 3, pull up control circuit 306 provides a control signal (IN_DT_N) to base bit circuit 302 and parallel bit pull up circuit 304. The plurality of output elements 528 in each of the bit pull up circuits 400 are selectively enabled and disabled according to the impedance-control code, U CTL BITs 1–8, to compensate for DC impedance variations due to PVT variations. The functionality of the pull up circuit 202 is described below with regard to the IN_DT_N control signal.

Description of Pull up Circuit Functionality

Base bit circuit 302 receives either a HIGH or LOW IN_DT_N signal, which either resistively couples VDDO to the driver output node or decouples VDDO from the driver output node OUT. Inverter 323 receives the IN_DT_N signal and provides an inverted bit signal, IN_DT_NBAR. The IN_DT_N signal and the inverted signal provide control for output element 328. More specifically, IN_DT_N is provided to the gates of PFET transistor 320, NMOS transistor 322 and PFET transistor 324, and the IN_DT_NBAR signal is provided to the gate of transistor 326. Output element 328 is enabled (resistively coupling VDDO to the driver output node OUT) when IN_DT_N is LOW and IN_DT_NBAR is HIGH. Output element 328 decouples VDDO from the driver output node when IN_DT_N is HIGH and IN_DT_NBAR is LOW. The net effect is that base bit circuit 302 pulls the output of the driver toward the upper power rail when IN_DT_N is LOW and appears as an open circuit and as a small capacitive load to the output node when IN_DT_N is HIGH.

Referring to FIGS. 3, 4 and 5 in combination, parallel bit pull up circuit 304 includes a plurality of parallel bit pull up circuits 400. More specifically, according to one embodiment, parallel bit pull up circuit 304 includes eight bit pull up circuits 400. Each bit pull up circuit 400 is connected to receive the high voltage input supply (VDDO) and the low voltage input supply (VSSO). Referring back to FIGS. 3 and 4, each bit pull up circuit 400 provides a pull down slew rate control current path, discussed in further detail below, that is provided to the pull down circuit 204. In the embodiment shown in the figures, each bit pull up circuit 400 receives one bit of an 8bit pull up impedance control signal U CTL BITs 1–8. In one embodiment, the parallel bit pull up circuit 304 receives the impedance control signals U CTL BITs 1–8 from a buffer (not shown). It is understood however, that the impedance control signals can alternatively come from other sources.

Referring to FIG. 5, each bit pull up circuit 400 includes an output element 528 that can be enabled or disabled to respond to the IN_DT_N signal in a similar manner to output element 328, discussed above. The plurality of output elements 528 in each of the bit pull up circuits 400 are selectively enabled and disabled according to the impedance control code U CTL BITs 1–8 to compensate for DC-impedance variations due to PVT variations.

More specifically, the output element 528 in each parallel bit pull up circuit 400 is either responsive to the IN_DT_N signal in the same manner as output element 328 or is not responsive to the IN_DT_N signal. When the corresponding U CTL BIT signal is LOW, output element 528 is turned off irrespective of the level of the IN_DT_N signal, and output element 528 is therefore not responsive to the IN_DT_N signal. Conversely, when U CTL BIT is HIGH, pull up output element 528 is responsive to IN_DT_N in that it is on when IN_DT_N is LOW and off when IN_DT_N is HIGH.

Bit control circuit 504 receives the IN_DT_N signal as well as a bit control signal U CTL BIT and provides a bit control output signal and the IN_DT_N signal to bit driver circuit 502. Bit driver circuit 502 receives the bit control signal U CTL BIT and IN_DT_N, and provides an output signal. Additionally, inverter 540 receives the bit control signal U CTL BIT and provides an inverted bit control signal. The bit control signal and the inverted bit control signal provide the control for transmission gate 542. More specifically, the gate of NMOS transistor 552 is coupled to the inverted bit control signal and transistor 550 is coupled to the bit control signal U CTL BIT. Transmission gate 542 receives the IN_DT_N signal and transmits the IN_DT_N signal when the bit control signal U CTL BIT is HIGH, and does not transmit the IN_DT N signal if U CTL BIT is LOW.

When U CTL BIT is HIGH, the output of inverter 540 is LOW and transmission gate 542 is ON. Thus, transmission gate 542 couples IN_DT_N to bit driver circuit 502.

Therefore, the output of bit driver circuit 502 responds to the IN_DT_N signal and provides an output. When U CTL BIT is LOW, the output of inverter 540 is HIGH and transmission gate 542 is off. Thus, bit driver circuit 502 is decoupled from IN_DT_N. Additionally, when U CTL BIT is LOW, PFET transistor 510 is on. PFET transistor 510 then pulls up the gate of PFET transistor 520, turning it off. Inverter 514 inverts the signal output of PFET transistor 510 so that the gate of NMOS transistor 522 is LOW, turning it off. Consequently, both transistors of output element 528 are off. Therefore, a high impedance is presented to the output OUT.

Controlling Impedance across PVT Variations, Pull up Circuit

Referring now to FIGS. 1, 2, 3 and 5 in combination, the pull up circuit 202 operates to control impedance across PVT variations depending upon operating conditions. For example, when component 102 is operating in the fastest PVT corner, only the output element 328 is enabled. Therefore, the PFET transistor 324 and NMOS transistor 326, together output element 328, located in base bit circuit 302 are each a predetermined size. In one embodiment, PFET transistor 324 and NMOS transistor 326 are sized so that the DC impedance of their parallel combination is approximately equal to the impedance of the transmission line (e.g., within 10% of 50 ohms) when the output voltage equals approximately VDDO/2 (within 10% of VDDO/2). In the bit pull up circuits 400 shown in FIG. 5, the two transistors making up output element 528, the PFET transistor 520 and NMOS transistor 522, are sized so that the enabling of each bit in sequence reduces the prevailing net impedance by a predetermined percentage. In one embodiment, for example, enabling all of the bit pull up circuits 400 sets the DC impedance of the driver to approximately the impedance of the transmission line when the component 102 is operating in the slowest PVT corner when the driver output voltage is VDDO/2. Thus, the DC impedance of the pull up circuit 202 may be set to a desired level of approximately equal to the impedance of the transmission line in all of the operating corners of the device by enabling and disabling the appropriate control bits U CTL BITs 1–8.

Controlling Impedance across Variations in Output Voltage, Pull up Circuit

Another characteristic controlled by the pull up circuit 202 is the impedance of the driver 110 across variations in output voltage, i.e., the voltage of the signal that is provided to bus 104 (see FIG. 1). More specifically, as the output voltage varies, the voltages across the terminals of each of the PFET and NMOS transistors in the pull up circuit 202 that are connected to the output node (OUT), and the transistors respective output resistances, also vary. Therefore, the design of pull up circuit 202 must compensate for the variations in the output resistances of the individual transistors so that the output impedance of the pull up circuit 202 remains fairly constant as the output voltage changes.

Conceptually, the voltages at the gates of PFET transistor 324 and the NMOS transistor 326 are inverted relative to each other and swing full rail from the voltage VSSO to the voltage VDDO. Therefore, the transistors are generally either both active or both inactive when the output voltage is between the voltage VDDO and the voltage VSSO. As the output voltage varies, the gate to source voltage of PFET transistor 324 is fixed, but the gate to source voltage of NMOS transistor 326 varies. As discussed below, NMOS transistor 326 is diode connected so that the drain to source voltage equals the gate to source voltage. The drain to source voltage of PFET transistor 324 decreases as the output voltage increases, thereby reducing the direct current (DC) impedance of PFET transistor 324 when the transistor is active. Additionally, the drain to source voltage of NMOS transistor 326 also decreases as the output voltage increases, but so does the gate to source voltage of NMOS transistor 326. The latter effect dominates, so the DC impedance of NMOS transistor 326 increases as the output voltage increases. As a result, when the output voltage changes, the DC impedance of the PFET transistor 324 changes in the opposite direction as that of the NMOS transistor 326 (i.e. as one increases, the other decreases). Therefore, the net output impedance of the parallel combination of the two transistors can stay constant as the output voltage changes. When PFET transistor 324 and NMOS transistor 326 are active, the impedances of the transistors move in opposite directions as the output voltage varies. As a result, the net impedance of the parallel combination of these two devices remains fairly constant despite variations in the output voltage when these transistors are active.

More specifically, PFET transistor 324 operates in its saturation region and as a nearly constant current source when the gate to source voltage of PFET transistor 324 is equal to its source voltage VDDO and its output voltage is near VSSO. Under these conditions, PFET transistor 324 operates in the saturation region because the drain to source voltage of PFET transistor 324 is near VDDO. In the saturation region, the output current, i.e. the drain to source current, changes very little as the drain to source voltage changes. When the output voltage moves more than a threshold voltage above VSSO, the drain to source voltage of PFET transistor 324 becomes less than the difference between its gate to source voltage and the threshold voltage. Accordingly, PFET transistor 324 operates in its linear region, so the drain to source current decreases significantly in a somewhat linear fashion as its drain to source voltage decreases and the output voltage increases.

NMOS transistor 326 is diode connected such that its gate is at the same voltage as its drain when in active mode. Accordingly, the drain to source voltage is identical to the gate to source voltage so that the drain to source voltage is always greater than the difference between the gate to source voltage and the threshold voltage. Thus, when NMOS transistor 326 operates in its saturation region it will continue in saturation region until the output voltage rises to within a threshold voltage of VDDO, at which point NMOS transistor 326 is "cut off". Because the gate to source and drain to source voltages vary simultaneously, the output current is a finction of each. Referring to FIGS. 6A, the effect from changing the gate to source voltage is shown to dominate, resulting in a drain to source current vs. output voltage ($I_{DS}$ vs. $V_{OUT}$) curve that is similar to the transistor's transconductance curve, i.e., the curve is nearly linear when the gate to source voltage exceeds the threshold voltage.

FIG. 6A shows a graph of the output current versus the output voltage for the pull up circuit 202, and shows that the net output current is the sum of the drain to source output currents of the parallel combination of transistors. One such combination of transistors is NMOS transistor 326 and the PFET transistor 324. The net output current, Inet, resembles the current-voltage curve of a constant resistor. Therefore, the total output impedance of the parallel combination of the PFET and NMOS transistors 324 and 326 is kept constant over a range of output voltages by arranging the transistors in the manner described above. Other examples of parallel combinations which provide this result include two appropriately coupled transistors (e.g., one being coupled in the manner described above and the other being diode connected).

When the PFET transistor 324 and the NMOS transistor 326 operate in parallel and the output voltage is less than a threshold voltage above VSSO, the slope of the net output current as a finction of the output voltage is similar to that of the NMOS transistor 326 transconductance curve. When the output voltage is greater than a threshold voltage above VSSO and more than a threshold voltage below VDDO, the slope of the curve is affected by both the transconductance curve of NMOS transistor 326 and the characteristic curve of the PFET transistor 324 operating in the saturation region. When the output voltage is within a threshold voltage of VDDO, the slope of the curve is determined entirely by the linear region of the PFET transistor 324 characteristic curve.

Description of Pull down Circuit Functionality

Referring now to FIGS. 2 and 7 in combination, pull down control circuit 706 includes a pull up control signal provided by pull up circuit 202. Pull down control circuit 706 provides IN_DT_N to base bit circuit 702 and parallel bit pull down circuit 704.

Referring to FIGS. 7, 8 and 9 in combination, parallel bit pull down circuit 704 includes a plurality of parallel bit pull down circuits 800. More specifically, according to one embodiment, parallel bit pull down circuit 704 includes eight bit pull down circuits 800. Each bit pull down circuit 800 is connected to receive the high voltage input supply (VDDO) and the low voltage input supply (VSSO). Additionally, each bit pull down circuit 800 receives the IN_DT_N signal and provides the output signal OUT as well as a slew rate control current path. Each bit pull down circuit 800 receives one bit of the 8-bit pull down impedance control signal (D CTL BIT1–D CTL BIT8), as in the pull up circuit shown in FIG. 4, described above.

Pull down base bit circuit 702 receives the IN_DT_N signal and, depending on whether or not IN_DT_N is HIGH or LOW, either couples or decouples node OUT to VSSO. As described above in the section entitled "Structure", pull down base bit circuit 702 includes inverter 723, transmission gate 710, NMOS transistor 730 and output element 790. The output element 790, when active, couples the output node OUT to VSSO. Inverter 723 receives the signal IN_DT_N, and inverts the signal to produce IN_DT_NBAR. The IN_DT_N signal is also provided to the gate of NMOS transistor 726, the gate of NMOS transistor 734, and the IN_DT_NBAR signal is provided to the gate of PFET transistor 724, and the gate of NMOS transistor 730.

The IN_DT_N signal and the inverted signal IN_DT_NBAR provide control for output element 790. As earlier described, output element 790 includes NMOS transistors 732 and 734, connected in parallel. Output element 790 determines the overall output of base bit circuit 702. The IN_DT_N signal goes directly to the gate of NMOS transistor 734, thereby directly controlling whether NMOS transistor 734 is enabled or disabled. The logic-level of input IN_DT_N also controls the enabling/disabling of transmission-gate 710 and determines whether NMOS transistor 730 is on or off.

Thus, if IN_DT_N is HIGH: 1) NMOS transistor 734 is turned on directly, 2) NMOS transistor 730 is off, and 3) the transmission-gate 710 is enabled, thereby coupling the gate of NMOS transistor 732 to the output node. (Note that the gate-source voltage of NMOS transistor 732 is a function of the output voltage, so that NMOS transistor 732 may be cut-off even if transmission-gate 710 is enabled.)

If IN_DT_N is LOW: 1) NMOS transistor 734 is turned off directly and 2) NMOS transistor 732 is turned off because transmission-gate 710 is disabled and NMOS transistor 730 is enabled so that NMOS transistor 730 pulls down the gate of NMOS transistor 732. In summary, if the IN_DT_N input is HIGH, the parallel combination of NMOS transistors 732 and 734 will couple the output node to the VSSO rail through a finite resistance. If the IN_DT_N input is LOW, the parallel combination of NMOS transistors 732 and 734 will present a high-impedance to the output node and base bit circuit 702 appears as a small capacitive load.

In one embodiment, parallel bit pull down circuit 704 receives a set of impedance control signals (D CTL BITs 1–8) from a buffer (not shown). However, it is understood that the impedance control signals can alternatively come from other sources. Parallel bit pull down circuit 704 also receives the IN_DT_N signal from pull down control circuit 706. As in the parallel bit pull up circuit 304, parallel bit pull down circuit 704 includes a plurality of pull down elements connected in parallel, one pull down element for each bit of the pull down impedance control signal D CTL BITs 1–8. Additionally, parallel bit pull down circuit 704 receives a slew rate control current path from the parallel bit pull up circuit FROM PULL UP CIRCUIT shown in FIG. 7.

The plurality of bit pull down circuits is shown in FIG. 8. As shown, parallel bit pull down circuit 704 includes a plurality of bit pull down circuits 800. The embodiment illustrated in FIG. 8 demonstrates eight bit pull down circuits, however, one skilled in the art will appreciate that the number of bit pull down circuits may be changed appropriately. Each bit pull down circuit 800 is connected to receive the high voltage input supply (VDDO) and the low voltage input signal (VSSO).

Referring to FIG. 9, each bit pull down circuit 800 includes a output element 990 that can be enabled or disabled to respond to the IN_DT N signal in a similar manner to output element 790, discussed above. Output element 990 includes NMOS transistor 922 and NMOS transistor 920. More specifically, output element 990 in each parallel bit pull down circuit 800 is either responsive to the IN_DT N signal in the same manner as output element 790 or is not responsive to the IN_DT N signal. When the corresponding D CTL BIT signal is LOW, output element 990 is turned off irrespective of the level of the IN_DT_N signal, and output element 990 is therefore not responsive to the IN_DT_N signal. Conversely, when the D CTL BIT signal is HIGH, output element is responsive to the level of the IN_DT_N signal.

More specifically, if the D CTL BIT input is HIGH, the transmission gate 942, consisting of PFET transistor 950 and NMOS transistor 952, is enabled and PFET transistor 964 is disabled, so that the enabling and disabling of the pull-up output element 990 is controlled by the IN_DT_N input in the same manner as in the base-bit circuit 702. If D CTL BIT is LOW, the transmission gate 942 is disabled, decoupling the output element 990 from the IN_DT_N input, and NMOS transistor 964 is enabled, causing the output element 990 to be disabled.

Thus, the output element 990 in each supplemental-bit-circuit 800 will be disabled if: 1) D CTL BIT is LOW, or 2) D CTL BIT is HIGH while IN_DT_N is LOW. If D CTL BIT is HIGH while IN_DT_N is HIGH, the output element 990 will be enabled. Those supplemental-bit-circuits 800 whose output elements are enabled present resistive coupling between the pull-down unit 204 output node and the VSSO rail in parallel with the pull down base-bit output element 790. Those with disabled output-elements 990 present high-impedance outputs to the pull-down unit's node.

If D CTL BIT is HIGH, thereby enabling the transmission-gate 942, then node IN_DT_N is coupled to the gate-capacitances of PFET transistor 926, NMOS transistor 928, NMOS transistor 930, and NMOS transistor 920. If D CTL BIT is LOW, node IN_DT_N is instead coupled, via NMOS transistor 956, to the gate-capacitance of PFET transistor 970. PFET transistor 970 is sized so as to have about the same gate-capacitances as the combination of PFET transistor 926, NMOS transistor 928, NMOS transistor 930, and NMOS transistor 920. Therefore, the capacitive loading of node IN_DT_N is about the same whether D CTL BIT is HIGH or LOW. This contributes to slew rate control of the pull down circuit 204. Also, the logic level of D CTL BIT determines whether NMOS transistor 940 is enabled or disabled, which contributes to slew rate control of the pull up circuit 202.

Controlling Impedance across PVT Variations Pull down Circuit

Impedance matching across PVT variations in pull down circuit 204 is accomplished in a manner similar to that of the pull up circuit 202.

Referring now to FIGS. 1, 2, 7 and 9 in combination, the pull down circuit 204 operates to control impedance across PVT variations depending upon circuit conditions. For example, when component 102 is operating in the fastest PVT corner, only output element 790 of the base bit circuit 702 is enabled. Therefore, the NMOS transistor 732 and NMOS transistor 734 of the pull down base bit circuit 702 are each a predetermined size so as to have the described characteristics. In one embodiment, similar to the pull up base bit circuit 302, NMOS transistor 732 and NMOS transistor 734 can be sized so that the DC impedance of their parallel combination is approximately the impedance of the transmission line (e.g., within 10% of 50 ohms) when the output voltage is approximately VDDO/2 (within 10% of VDDO/2). In the bit pull down circuits 800 shown in FIG. 9, the two transistors making up output element 990, NMOS transistor 920 and NMOS transistor 922, are sized so that the enabling of each bit in sequence reduces the prevailing net impedance by a predetermined percentage. In one embodiment, similar to the pull up circuit 202, pull down circuit 204 may set the DC impedance to a desired level of slightly more than the impedance of the transmission line in all of the operating corners of the device by enabling and disabling the appropriate control bits D CTL BITs 1–8.

Controlling Impedance across Variations in Output Voltage Pull Down Circuit

The linearization of the pull down impedance across variations in the output voltage is also accomplished in a manner related to that of the pull up circuit 202. That is, transistors are connected in parallel whose impedances change in opposite directions as the output voltage changes. Consequently, with proper channel sizing, the net impedance of the parallel combination stays nearly constant over the range of output voltages.

Although each bit of the pull up circuit 202 achieves impedance linearization by connecting a PFET transistor in parallel with an NMOS transistor, it would be impractical to use a P channel device in the output element of the pull down circuit as the width of the P channel device would have to be very large. Accordingly, pull down circuit 204 connects two NMOS transistors in parallel for each bit output element of the pull down circuit 204. For example, in the base bit circuit 702, NMOS transistors 732 and 734, together output element 790, are connected in parallel. Transistor 734 functions as a normal NMOS pull down transistor, i.e., when active, the gate to source voltage of the transistor stays fixed and the drain to source impedance decreases as the drain to source voltage (i.e., the output voltage relative to the voltage VSSO) decreases. In contrast, transistor 732 is diode connected via transmission gate 710, so that the gate to source voltage of transistor 732 decreases as the output voltage decreases, therefore causing the drain to source impedance of transistor 732 to increase. As a result of NMOS transistors 732 and 734 being connected in parallel and as a result of their output impedances changing in opposite directions as the output voltage changes, the overall output impedance of their parallel combination remains fairly constant over the range of output voltages.

When signal IN_DT_N is HIGH, the gate of transistor 732 is connected to the output node by transmission gate 710, made up of PFET transistor 724 and NMOS transistor 726. As the output voltage is pulled down, the gate to source voltage of transistor 732 decreases. Although the drain to source voltage of NMOS transistor 732 also decreases, tending to decrease the drain to source impedance, the effect of the gate to source voltage decreasing is greater, thereby increasing the drain to source impedance. Because the impedance of transistor 734 and transistor 732 move in opposite directions as the output voltage changes, the impedance of the parallel combination of transistor 734 and transistor 732 stays fairly constant.

As with the pull up circuit 202, the output characteristics of the enabled pull down circuit 204 can be analyzed in terms of currents rather than impedances. With the pull down circuit 204, transistor 734 operates in its saturation region and acts as a nearly constant current source when the output voltage is less than a threshold voltage below the voltage VDDO. When the output voltage is more than a threshold voltage below VDDO, transistor 734 operates in its linear region. When the output voltage is more than a threshold voltage above the voltage VSSO (and transmission gate 710 is on), transistor 732 operates in its saturation region, otherwise transistor 732 is cut off.

FIG. 6B shows a graph of the output current versus the output voltage for the pull down circuit 204 showing that the output current is the sum of the currents for NMOS transistor 734 and NMOS transistor 732. The net output current, Inet, resembles the current-voltage curve of a constant resistor. Therefore, the total output impedance of the parallel combination of the two NMOS transistors 732 and 734 is kept constant over a range of output voltages by arranging the transistors in the manner described above.

As with similar components in pull up circuit 202, the output current of transistor 734 follows its characteristic curve as the output voltage varies, while the output current of transistor 732 follows its transconductance curve. Proper relative sizing of the two transistors and proper relative timing of their activation produces a fairly linear relationship between the net output current and the output voltage over most of the output swing. When transistor 732 is cut off, this relationship is controlled entirely by the linear region of the characteristic curve of transistor 734.

Additionally, NMOS transistor 726 and PFET transistor 724 have different roles relative to the timing of the activation of NMOS transistor 732. More specifically, as the node IN_DT_N goes HIGH, transistor 726 turns on, which pulls up the gate of transistor 732. This allows the activation of transistor 732 to be nearly simultaneous with that of NMOS transistor 734. Further, the activation of NMOS transistor 724 is delayed by inverter 723, so that NMOS transistor 726 bears the full burden of activation of NMOS transistor 732 early in the transition. Because NMOS transistor 726 is an N-channel device, it can only pull up the gate of NMOS transistor 732 to the output voltage minus a threshold voltage. However, by the time transistor 726 has pulled the gate up this far, PFET transistor 724 has become active and can pull the gate of transistor 732 the rest of the way to the level of the output voltage.

Referring back to FIG. 9, the output element 990 located in each bit pull down circuit 800 has transistors connected in parallel, shown as NMOS transistor 920 and NMOS transistor 922. The function of output element 990 can be analyzed in a similar manner as that of the NMOS transistors 732 and 734 in output element 790. Transistor 920 functions as a normal NMOS pull down transistor, i.e., when active, the gate to source voltage of the transistor stays fixed and the drain to source impedance decreases as the drain to source voltage (i.e., the output voltage relative to the voltage VSSO) decreases. In contrast, transistor 922 is diode connected via transmission gate 910, so that the gate to source voltage of NMOS transistor 922 decreases as the output voltage decreases, causing the drain to source impedance of transistor 922 to increase. As a result of NMOS transistors 922 and 920 being connected in parallel, and as a result of their respective output impedances changing in opposite directions as the output voltage changes, the overall output impedance of their parallel combination remains fairly constant over the range of output voltages.

Control of Output Slew Rate and Crowbar Current

Overview

Control of the output slew rate of driver 110 improves signal integrity, saves power consumption and allows high speed bus switching. Moreover, controlling the driver output slew rate is needed for several purposes including: 1) to limit bounce in signal power and ground lines due to rapid current changes (i.e., a large di/dt) through parasitic inductances; 2) to control the fraction of the cycle period consumed by the rise and fall times of the output signal; and 3) to limit the crowbar current by limiting the period during which both the pull up and pull down circuits of driver 110 are simultaneously active.

Controlling signal and power bounce prevents chip performance degradation by preventing reduced noise margins and signal transmission errors. Preventing rail bounce also prevents such noise from being coupled into the signals produced by the output drivers. Preventing such coupled bounce and preventing bounce due to signal line parasitics prevents the reduction of noise margins for signals at the receiving ends of the signal lines.

More specifically, if pull up circuit 202 and the pull down circuit 204 are active simultaneously, current can flow through them (via their connection at the output node) directly from the power rail to the ground rail. This current, called crowbar current, generally contributes little to driver performance, and therefore, constitutes wasted consumption of power. Also, this current can contribute to di/dt magnitudes thereby increasing rail bounce. Therefore, preventing crowbar current is an important consideration in controlling signal and power bounce, and in minimizing wasted power.

In pull up circuit 202, the output slew rate is controlled by controlling the slew rate of the IN_DT_N signal provided by pull up control circuit 306. Pulling up the IN_DT_N signal turns off the enabled output elements in pull up circuit 202 while pulling down the IN_DT_N signal turns on the enabled output elements in pull up circuit 202.

The turning off of the enabled output elements in pull up circuit 202 has different slew rate requirements than the turning on of the enabled output elements in pull up circuit 202. For example, slew rate control circuitry must prevent the turning on of the pull up circuit 202 from being too fast so as to cause intolerable rail bounce, while slew rate control circuitry must turn off pull up circuit 202 quickly enough to limit crowbar current. Accordingly, different slew rate strategies are employed for controlling the rates of pulling up and pulling down the IN_DT_N signal node when turning the unit off and on as discussed below.

The pull down circuit 204 controls the output slew rate and crowbar current in a manner similar to that used for the pull up circuit 202. Pull up circuit 202 controls output slew rate by controlling the slew rate at its node IN_DT_N, which is the common gate node of a plurality of pull up elements. Similarly, pull down circuit 204 controls output slew rate by controlling the slew rate at its node IN_DT_N, which is also the common gate node of a plurality of pull down elements.

As discussed in more detail below, turning on the enabled output elements in pull up circuit 202 and turning off the enabled output elements of pull up circuit 202 result in different slew rate control considerations. Likewise, different slew rate control considerations must be taken into account when turning on the enabled output elements of pull down circuit 204 than when turning off the enabled output elements in pull down circuit 204 in order to control the slew rate.

Control During Turning off of the Pull Up Circuit The design of pull up circuit 202 controls slew rate and crowbar current by ensuring that the turning off of the enabled output elements in pull up circuit 202 is fast enough in every PVT corner, thereby preventing excessive amounts of crowbar current caused by an overlap with the turning on of the enabled output elements in pull down circuit 204.

Unlike other drivers that are not open circuited at destination nodes, the slew rate of the pull up circuit 202 is not limited as to how fast it may turn off because driver 110 operates in a source-terminated mode. As a result of this mode, there is little danger of a large change in current with respect to time (di/dt) when the driver 110 pulls the transmission line to the rail for a HIGH signal because little or no current flows through the pull up circuit 202 just before it turns off, assuming the transmission line has become fully charged HIGH. Accordingly, the change in current with respect to time of the pull up circuit 202 is very small regardless of the rate at which the pull up circuit 202 is turned off. The concern in circuit design is therefore limited to ensuring that the pull up circuit turns off quickly.

Referring back to FIG. 3, pull up control circuit 306 includes DATA signal, from pull down circuit 204, FROM PULL DOWN CIRCUIT, a PFET transistor 340, an NMOS transistor 342, and an NMOS transistor 344. These three transistors drive node IN_DT_N shown in FIG. 3. The PFET transistor 340 turns off the pull up circuit 202 by pulling up node IN_DT_N. Accordingly, transistor 340 must be sized so that even in the slowest PVT corner its gate to source voltage drops below its threshold voltage before the gate to source voltage in the pull down elements rise enough to allow the pull down elements to turn on. As a result, this ensures that the node IN_DT_N is pulled up sufficiently fast in the slowest PVT corner to limit crowbar current. In faster PVT corners, PFET transistor 340 pulls up node IN_DT_N even faster than in the previously described slower PVT corners.

Control During Turning On of the Pull Up Circuit

Unlike the turning off of the pull up circuit 202, turning the pull up circuit 202 on does produce a significant instantaneous change in current (di/dt). Therefore, the output slew rate must be slow enough to avoid generating line bounce, while being fast enough to prevent the output rise time from consuming too much of the cycle period. Turning on of the pull up circuit 202 must also be slow enough not to overlap too much with the turning off of the pull down circuit 204 so as to generate too large a crowbar current.

The strategy for keeping this output slew rate fairly constant across PVT variations is to properly control the net resistance of the appropriate transistors that are driving the node IN_DT_N and to properly control the net capacitance loading node IN_DT_N, thereby controlling the slew rate of the voltage at node IN_DT_N.

Referring to FIG. 3, and FIGS. 7, 8 and 9 in combination, turning on of pull up circuit 202 is accomplished by pulling down node IN_DT_N with NMOS transistor 342 and NMOS transistor 344 operating in parallel. Transistor 344 is connected in series with a parallel set of eight NMOS transistors located in the plurality of generic pull down bit circuits in the parallel bit pull down circuit 704 shown in FIG. 7. This set includes the NMOS transistors 940 (see FIG. 9, described in further detail below) located in each of the plurality of pull down bit circuits 800 (see FIG. 8). The pull down current paths through the plurality of bit pull down circuits 800 are used to control the slew rate of the pull up circuit 202. The current paths go through the plurality of nodes TO 202 shown in FIG. 9. The plurality of transistors in the parallel set of NMOS transistors 940 pull down to the voltage VSSO.

These transistors 940 are selectively enabled and disabled by PVT compensation control bits (D CTL BITs 1–8 shown in FIG. 8), which enable and disable the plurality of bit pull down circuits 800. As a result, the net impedance of this parallel set of transistors, which limits the amount of current that can flow through transistor 344 is also controlled to compensate for PVT variations.

The plurality of NMOS transistors 940 are sized so that the current flowing through the parallel combination of NMOS transistors 342 and 344 produces a desirable slew rate for the pulling down of node IN_DT_N that is consistent across PVT variations. In the fastest corner, each of the plurality of NMOS transistors 940 are disabled and all of the current flows through NMOS transistor 342 and none through NMOS transistor 344. Accordingly, NMOS transistor 342 is sized to give the desired slew rate under these circumstances.

In slower PVT corners less current flows through NMOS transistor 342, since it is more resistive than in faster corners. To compensate, current must be allowed to flow through NMOS transistor 344. In such case, NMOS transistor 940 in one or more of the parallel bit pull down elements 800 must be enabled as necessary for maintaining the desired net current through the parallel combination of NMOS transistors 342 and 344 in the particular PVT corner. The net effect is that the net output resistance of the transistors that pull down node IN_DT_N (i.e., NMOS transistor 342 and the series combination of NMOS transistor 344 and the plurality of parallel NMOS transistors 940) is kept fairly constant across PVT corners.

Referring to FIG. 5, as described above, bit pull up circuit 400 includes bit driver circuit 502, bit control circuit 504 and slew rate control circuit 506.

As discussed above, bit pull up circuit 400 responds to U CTL BITs 1–8. When U CTL BIT is HIGH, IN_DT_N is capacitively loaded by the gates of PFET transistor 520, NMOS transistor 526 and PFET transistor 530.

When U CTL BIT is LOW, the IN_DT_N signal is decoupled from the gates of PFET transistor 520, NMOS transistor 526 and PFET transistor 530. However, PFET transistor 556 is on and coupling IN_DT_N to the gate NMOS transistor 564, which is sized to present the same capacitive load as the capacitive load represented by the sum of PFET transistor 520, NMOS transistor 526 and PFET transistor 530.

Therefore, the capacitive loading of the node IN_DT_N can be determined from calculating the sum of the gate capacitances of the appropriate NMOS and PFET transistors. These transistors include: 1) in the base bit circuit 302, PFET transistor 324 and the inverter elements, PFET transistor 320 and NMOS transistor 322 (see FIG. 3); 2) in each of the enabled pull up bit circuits 400, (i.e. those for which U CTL BIT is HIGH), PFET transistor 520, NMOS transistor 526 and PFET transistor 530; and 3) in each disabled pull up bit circuits 400, (i.e. those for which U CTL BIT is LOW), the NMOS transistors 564.

Consequently, the loading of node IN_DT_N remains fairly constant across VT variations. The aggregate gate area that loads node IN_DT_N is the same egardless of which bit circuits are enabled or disabled because, in each bit circuit 400, the gate area of NMOS transistor 564 is the same as the sum of the gate areas of PFET transistor 520, NMOS transistor 526 and PFET transistor 530. The changes in gate area and oxide thickness with PVT variations are small relative to the overall gate dimensions, so the changes in gate capacitance of each individual transistor from one PVT extreme to the other extreme are small.

Functionally, when enabled, NMOS transistor 550 and PFET transistor 552 feed current to the gate areas of PFET transistor 520, NMOS transistor 526 and PFET transistor 530. Additionally, when enabled, PFET transistor 556 feeds current to the gate area of NMOS transistor 564. However, NMOS transistor 550, PFET transistor 552 and PFET transistor 556 are sized appropriately so that the degree to which transistors 550, 552 and 556 limit current is small compared to that of PFET transistor 340, NMOS transistor 342 and NMOS transistor 344 shown in FIG. 3. The sizing of transistors 550, 552, and 556 prevents them from acting as limiting resistive elements as compared to PFET transistor 340 and NMOS transistors 342 and 344.

Accordingly, both the capacitive loading and resistive elements driving node IN_DT_N are well-controlled across PVT variations. Thus, the slew rate for the downswing of node IN_DT_N is well controlled, which allows the output pull up slew rate to be set to a desired value and kept fairly constant across PVT variations.

Referring back to FIG. 3, base bit circuit 302 contains PFET transistor 320 and NMOS transistor 322 (together inverter 323), that are appropriately sized so that pull up NMOS transistor 326, whose gate is driven by inverter 323, turns on at approximately the same time and at the same rate as pull up PFET transistor 324. Each bit pull up circuit 400, shown in FIG. 5, contains inverter transistors, PFET transistor 530 and NMOS transistor 526, that are sized to introduce a normal inverter delay between the turning on of PFET transistor 520 and NMOS transistor 522. Because the sum of the current contributions of the plurality of NMOS transistors 522 in the parallel bit pull up circuits 400 are small relative to the rest of the pull up circuit 202 the effect of the small delay between the turning on of PFET transistor 520 and the turning on of NMOS transistor 522 is small relative to the overall pull up function.

Variations at the Extremes of the Swing of NODE IN_DT_N—Pull Up Circuit

At the extremes of the swing of node IN_DT_N, there is a variation in the capacitive loading of node IN_DT_N across PVT variations. This variation is due to the main load coming from the gates of each PFET transistor 520 coupled to each enabled circuit 400, and the gates of each NMOS transistor 564 coupled to each disabled circuit 400. The variation in capacitive loading only plays a significant role when the difference between the voltage of the node IN_DT_N and that of one of the voltage rails is less than a threshold voltage.

When the voltage on node IN_DT_N is HIGH, the channel of transistor 564 in each disabled bit circuit 400 is inverted, while the channel of transistor 520 in each enabled bit circuit 400 is not inverted. Therefore, only the disabled bit circuits 400 contribute significant capacitive loading at this time. Accordingly, the node IN DT N is more heavily loaded in the faster PVT corners in which more bit circuits 400 are disabled, than in the slower PVT corners. This extra loading slows and delays the beginning of the pulling down of the node IN_DT_N. This configuration is helpful in high voltage corners in preventing the turning on of the pull up circuit 202 from overlapping the turning off of the pull down circuit 204, thus reducing any crowbar current flow.

Once the voltage of node IN_DT_N falls more than a threshold voltage below VDDO, the channels of PFET transistors 520 invert. When this occurs, each of the plurality of bit circuits 400 contribute fairly equally to the capacitive loading of node IN_DT_N regardless of the PVT corner and the slew rate is fairly invariant between corners of the PVT variations.

When the voltage on node IN_DT_N falls to less than a threshold voltage above the voltage VSSO, the channels of the NMOS transistors 564 cease to be inverted and the plurality of PFET transistors 556, which connect the gates of transistor 564 to the node IN_DT_N, turn off. Therefore, in the faster PVT corners, which have more disabled bit circuits 400, the capacitive loading of the node IN_DT_N abruptly drops. This condition allows the completion of the pulling down of node IN_DT_N to happen relatively rapidly in the faster corners of the PVT variations, but not so rapidly as to produce excessive change in current with respect to time (di/dt) in the output current. Moreover, this condition compensates for the initial delay as well as for the extra voltage swing that must be traversed in the higher voltage corners of the PVT variations. Accordingly, the overall fall time for the node IN_DT_N is fairly consistent between the corners of the PVT variations.

For LOW to HIGH transitions of the node IN_DT_N, the effect of this differential capacitive loading at the extremes of the swing is to make the initial portion of the rise relatively quick for faster PVT corners as compared to slower corners, and the final portion relatively slow. This condition has no special effect on the performance of driver 110 because PFET transistor 340, which is pulling up node IN_DT_N, is sized large enough to pull the node up sufficiently fast in all corners to prevent significant overlap with the turning on of the pull down circuit 204, thereby minimizing crowbar current.

Control of Output Slew Rate and Crowbar Current Using Pull down Circuit

Turning Off of the Pull Down Circuit

In pull down circuit 204, control of the output slew rate and of crowbar current is accomplished in a manner similar to that used for pull up circuit 202. More specifically, the output slew rate is controlled by controlling the slew rate of the node IN_DT_N, which is the common gate node of the nine pull down transistors, as described below. Pulling up node IN_DT_N turns on the output elements of the pull down circuit 204 while pulling the node IN_DT_N down turns off the output elements of pull down circuit 204. Turning off of the pull down circuit 204 has different slew rate requirements than turning on the pull down circuit 204. Accordingly, different strategies are used for controlling the rates of pulling up and pulling down the node IN_DT_N.

Because driver 110 is intended to operate in a source terminated mode, there is little danger of the turning off of the pull down circuit 204 happening too fast, i.e., with too large an instantaneous change in current, di/dt. Driver 110 pulls the transmission line 104 all of the way down to the rail when driving a LOW signal, so there is little or no current flowing through the pull down circuit 204 just before pull down circuit 204 turns off. Accordingly, the di/dt through the pull down circuit 204 as it is being turned off is very small regardless of the rate at which the node IN_DT_N is pulled down. Therefore, the only requirements on the slew rate for pulling down of node IN_DT_N is that the pulling down be fast enough in every PVT corner to prevent excessive amounts of crowbar current due to overlap with the turning on of the pull up circuit 202.

Referring back to FIG. 7, pull down control circuit 706 receives DATA signal, a slew rate control current path from pull up circuit 202, FROM PULL UP CIRCUIT, and includes PFET transistor 744, NMOS transistor 740, and PFET transistor 742 and outputs the IN_DT_N signal. The NMOS transistor 740 turns off the output elements of pull down circuit 204 by pulling down node IN_DT_N. To limit crowbar current, NMOS transistor 740 is sized to pull down node IN_DT_N sufficiently fast in the slowest PVT corner so that the gate to source voltages of the pull down output elements (i.e., the parallel combination of NMOS transistor 732 and NMOS transistor 734, and the parallel combination of NMOS transistor 920 and NMOS transistor 922) drop below their threshold voltage (turning them off) before the gate to source voltage of the pull up output elements (i.e. elements 328 and 528, shown in FIGS. 3 and 5) exceed their threshold voltages (turning them on). IN_DT_N will be pulled down by transistor 740 even faster in other (i.e., faster) PVT corners.

In the base bit pull down circuit 702, the inverter elements, PFET transistor 720 and NMOS transistor 722, are sized so that PFET transistor 724 turns off and NMOS transistor 730 turns on (thereby pulling down the date of NMOS transistor 732, turning it off) fast enough to limit crowbar current. Similarly, in parallel bit pull down circuits 800, the inverter elements 926 and 928 are sized so that PFET transistor 932 turns off and NMOS transistor 924 turns on fast enough to limit crowbar current. NMOS transistor 924 pulls down the gate of NMOS transistor 922 and turns off NMOS transistor 922.

Turning On of the Pull Down Circuit

Unlike turning off the output elements of pull down circuit 204, turning on pull down circuit 204 does produce a significant instantaneous current change, i.e. di/dt. Therefore, the output slew rate must be slow enough to avoid generating line bounce and fast enough to prevent the output fall time from consuming too much of the cycle period. Turning on pull down circuit 204 must also be slow enough not to overlap with the turning off of pull up circuit 202, otherwise the circuits generate too large a crowbar current. The strategy for keeping this output slew rate fairly constant across PVT variations is to control the net resistance driving node IN_DT_N, and the net capacitance loading node IN_DT_N, thereby controlling the slew rate of the voltage of node IN_DT_N.

Referring to FIG. 5 and FIG. 7 in combination, turning on pull down circuit 204 is accomplished by pulling up node IN_DT_N via PFET transistors 744 and 742 functioning in parallel. Transistor 744 is connected in series with a parallel set of a plurality of PFET transistors, specifically transistors 560 of pull up bit circuits 400 (see FIG. 5). As discussed below, these eight transistors are selectively enabled and disabled by the same control bits which enable and disable the individual bit pull up circuits 400. Accordingly, controlling the net impedance of this parallel set of transistors limits the amount of current that flows through transistor 744 and compensates for PVT variations in the output resistances of individual PFET transistors.

PFET transistors 560 are sized so that the current flowing through the parallel combination of PFET transistors 744 and 742 produces a desirable slew rate for pulling up node IN_DT_N consistently across PVT variations. In the fastest corner, all eight PFET transistors 560 are disabled, all of the current flows through PFET transistor 742, and no current flows through PFET transistor 744. Accordingly, PFET transistor 742 is sized to give the desired slew rate under these circumstances.

In slower PVT corners, one or more of the parallel set of PFET transistors 560, which are in series with PFET transistor 744, are enabled. Thus, the net resistance driving node IN_DT_N is kept fairly constant across PVT corners.

The pull up control bits are used even though this is a pull down circuit because PFET transistors 560, 742 and 744 are pulling up to the voltage VDDO and because the pull up codes U CTL BITs 1–8 are designed to compensate for PVT variations in the impedance of P channel transistors. The pull down control bits D CTL BITs 1–8 compensate for PVT variations in N-channel pull down transistors. It will be appreciated by those skilled in the art that the number of bit control circuits can be increased or decreased and that eight bit control circuits are shown for exemplary purposes only.

Referring to FIGS. 7 and 9 in combination, the capacitive loading of the node IN_DT_N is the sum of the gate capacitances of several transistors. These transistors include: 1) in the base bit circuit 702, NMOS transistor 734, PFET transistor 720, NMOS transistor 722, NMOS transistor 726; 2) in each enabled pull down bit circuit 800 (i.e., those for which D CTL BIT is HIGH) NMOS transistors 920 and 930, PFET transistor 926 and NMOS transistor 928; and 3) in each disabled pull down bit circuit 800, (i.e., those for which D CTL BIT is LOW) PFET transistor 970.

In each bit circuit 800, the gate area of PFET transistor 970 is approximately the same as the sum of the gate areas of NMOS transistor 920, NMOS transistor 930, PFET transistor 926 and NMOS transistor 928. Consequently, the loading of node IN_DT_N remains fairly constant across PVT variations since the aggregate gate area that loads node IN_DT_N is the same regardless of which bit circuits are enabled or disabled. The changes in gate area and oxide thickness with PVT variations are small relative to the overall gate dimensions, so the changes in gate capacitance of each individual transistor from one PVT extreme to the other extreme are small.

PFET transistor 950 and NMOS transistor 952 which feed current to the capacitive gates of NMOS transistor 920, NMOS transistor 930, PFET transistor 926 and NMOS transistor 928 are wide enough that the degree to which PFET transistor 950 and NMOS transistor 952 limit current is small compared to that of PFET transistors 742 and 744 and NMOS transistor 740, located in the pull down control circuit 706. Similarly, NMOS transistor 956 is wide enough not to limit the current to PFET transistor 970.

Accordingly, both the capacitive loading and resistive elements driving node IN_DT_N are well-controlled across PVT variations. Thus, the slew rate for the upswing of node IN_DT_N is well controlled, which allows the output pull down slew rate to be set to a desired value and kept fairly constant across PVT variations.

Additionally, base bit circuit 702 contains PFET transistor 720 and NMOS transistor 722, together inverter 723, that are appropriately sized to keep the delay small between the turning on of transmission gate transistors, NMOS transistor 726 and PFET transistor 724. Accordingly, PFET transistor 724 becomes enabled by the time the pull up drive strength of NMOS transistor 726 begins to wane. Each bit pull down circuit 800, shown in FIG. 8, contains inverter transistors 912 that are sized to introduce a normal inverter delay between the turning on of NMOS transistor 930 and PFET transistor 932. This delay is so small as to cause little effect on the pull down function.

Variations at the Extremes of the Swing of Node IN_DT_N—Pull Down Circuit

At the extremes of the swing of node IN_DT_N, there is a variation in the capacitive loading of node IN_DT_N across PVT variations. This variation derives from the fact that the main load contributed by each enabled bit circuit is the gate of an NMOS transistor 920, while that of each disabled bit is the gate of a PFET transistor 970. This situation only plays a significant role when the difference between the voltage of the node IN_DT_N and that of one of the rails is less than a threshold voltage.

When the voltage on node IN_DT_N is LOW, the channel of PFET transistor 970 in each disabled bit circuit 800 is inverted. Meanwhile, the channel of NMOS transistor 920 in each enabled bit circuit is not inverted. Thus, only the disabled bit circuits 800 contribute significant capacitive loading at this time. Accordingly, the node IN_DT_N is more heavily loaded in the faster PVT corners in which more bits are disabled, than in the slower PVT corners. This extra loading slows and delays the beginning of the pulling up of the node IN_DT_N. This configuration is helpful in high voltage corners in preventing the turning on of the pull down circuit 204 from overlapping the turning off of the pull up circuit 202, thus reducing any crowbar current flow.

Once the voltage of node IN_DT_N rises more than a threshold voltage above VSSO, the channels of transistors 920 of the enabled bit circuits become inverted. When this occurs, all eight bit circuits contribute fairly equally to the capacitive loading of node IN_DT N regardless of the PVT corner and the slew rate is fairly invariant between corners of the PVT variations.

When the voltage on node IN_DT_N rises to less than a threshold voltage below the voltage VDDO, the channels of the PFET transistors 970 cease to be inverted and the transistors 956 connecting the gates of the PFET transistors 970 to the node IN_DT_N turn off. Therefore, in the faster corners, which have more disabled bits, the capacitive loading of the node IN_DT_N abruptly drops. This condition allows the completion of the pulling up of node IN_DT_N to happen relatively rapidly in the faster corners of the PVT variations; but not so rapidly as to produce excessive instantaneous current changes (di/dt) in the output. This condition compensates for the initial delay as well as for the extra voltage swing that must be traversed in the higher voltage corners of the PVT variations. Accordingly, the overall rise time for the node IN_DT_N is fairly consistent between the corners of the PVT variations.

For HIGH to LOW transitions of the node IN_DT_N, the effect of this differential capacitive loading at the extremes of the swing is to make the initial portion of the fall relatively quick for faster PVT corners as compared to slower corners, and the final portion relatively slow. This condition has no special effect on the performance of driver 110 as the NMOS transistor 740 pulling down node IN_DT_N is sized large enough to pull the node down sufficiently fast in all corners to prevent significant overlap with the turning on of the pull up circuit 202, thereby minimizing crowbar current.

Other Embodiments

Other embodiments are within the following claims. One of ordinary skill in the art appreciates that the driver herein disclosed alternatively includes either or both slew rate control circuitry and impedance control circuitry within the driver.

For example, the signals shown in the figures do not include optional signals that one skilled in the art would appreciate. In one embodiment, pull up control circuit 306 optionally receives a plurality of signals that may include a clock signal, an inverted data signal, an output enable signal, a scan input signal and a select data signal as well as other signals provided by pull down circuit 204 (see FIG. 2). As another example, pull down control circuit 706 receives an inverted DATA signal and, in one embodiment, receives a plurality of additional signals, which may include a clock signal, an output enable signal, and an input signal.

Additionally, one skilled in the art appreciates that components within both the pull up circuit 202 and the pull down circuit 204 may optionally be represented by multiplexers. In one embodiment, for example, pull up circuit 202 and pull down circuit 204 are represented by multiplexers wherein a control signal determines whether a data input or a test input controls the output of the pull up and pull down circuits 202 and 204. In another embodiment, components within both the pull up circuit 202 and the pull down circuit 204 are represented by inverting multiplexers.

In another embodiment, data inputs to the pull up circuit 202 and pull down circuit 204 are genterated by a contol-logic/clock-header/flop cell that contains logic circuitry to convert various control and ata inputs into appropriate signals for driving the appropriate overal driver output.

In the present invention, a transistor may be conceptualized as having a control terminal which controls the flow of current between a first current handling terminal and a second current handling terminal. An appropriate condition on the control terminal causes a current to flow from/to the first current handling terminal and to/from the second current handling terminal. In a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current exiting the base causes an emitter-to-collector current to flow.

A MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N channel MOS device equations merely refers to whichever diffusion (drain or source) has the lower voltage at any given time. For example, the "source" of an N channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source", with an implicit understanding that the two are not distinct, but interchangeable.

What is claimed is:

1. A method for providing control slew rate of a driver having an impedance control, the method comprising:

providing the driver with a circuit, the circuit receiving a input signal and providing an output signal, the circuit including a plurality of output elements;

providing a capability to disable a first plurality of the plurality of output elements in the circuit and a capability to enable a second plurality of the plurality of output elements in the circuit wherein the disenabling of the first plurality of the plurality of output elements is independent of the enabling of the second plurality of the plurality of output elements; and controlling a net resistance of the plurality of output components driving a node of the input signal.

2. The method of claim 1 further comprising:

controlling a net capacitance of a plurality of components loading the node of the input signal.

3. The method of claim 1 wherein:

the controlling the net resistance includes receiving a control signal, the control signal selectively enabling and disabling the plurality of components driving the node of the input signal.

4. The method of claim 2 wherein:

the controlling the net capacitance includes receiving a control signal, the control signal selectively enabling and disabling the plurality of components loading the node of the input signal.

5. The method of claim 1 further comprising:

in the plurality of components, including a parallel set of transistors; and sizing the plurality of components to account for a current flowing through the parallel set of transistors, the sizing of the plurality of components contributing to the control of the slew rate.

6. The method of claim 2 further comprising:

in the plurality of components, including a first plurality of transistors and a second plurality of transistors; and sizing the first plurality of transistors to present a capacitive load substantially equal to the second plurality of transistors.

7. The method of claim 4 wherein the controlling the net capacitance and the controlling the net resistance are based on an impedance control signal.

8. The method of claim 1 wherein the components driving the node of the input signal and the plurality of components loading the node of the input signal include transistors.

9. The method of claim 1 further comprising:

providing the circuit with a pull up circuit, the pull up circuit receiving an input signal and providing an output signal, the pull up circuit including a plurality of pull up output elements;

providing the circuit with a pull down circuit having an impedance, the pull down circuit receiving the input signal and being coupled with the pull up circuit to provide the output signal, the pull down circuit including a plurality of pull down output elements;

cross-coupling the pull down circuit with the pull up circuit by providing a pull down slew rate control current path from the pull up circuit to the pull down circuit; and providing a pull up slew rate control current path from the pull down circuit to the pull up circuit.

10. The method of claim 9 further comprising:
coupling the driver to a voltage supply and coupling the driver to a low voltage supply;
providing the driver with an output terminal; and
providing the pull up circuit with a base bit pull up circuit, the base bit pull up circuit including an output element coupled between the output terminal and the voltage supply.

11. The method of claim 10 wherein the output element includes a first transistor and a second transistor coupled in parallel, the first transistor having a first impedance and the second transistor having a second impedance, the first impedance changing in a direction opposite to the second impedance when an output voltage changes.

12. The method of claim 11 wherein the sum of the first impedance and the second impedance are approximately constant across output voltage changes.

13. The method of claim 10 further comprising:
providing the pull up circuit with a pull up control circuit, the pull up control circuit receiving the input signal and receiving the pull up slew rate control current path from the pull down circuit and providing a control signal to the base bit pull up circuit, the control signal being related to the input signal.

14. The method of claim 12 further comprising:
providing the pull up circuit with a parallel bit pull up circuit, the parallel bit pull up circuit including a plurality of bit pull up elements and each of the plurality of bit pull up elements receiving a bit of a pull up control signal.

15. The method of claim 13 wherein each of the plurality of bit pull up elements includes a bit driver circuit and a bit control circuit coupled to the bit driver circuit, the bit control circuit determining whether the bit of the pull up control signal corresponding to the bit pull up element is active, the bit control circuit providing the bit driver circuit with the control signal when the bit of the pull up control signal is active.

16. The method of claim 14 wherein each of the plurality of bit pull up elements is responsive to the input signal if the bit of the pull up control signal corresponding to the bit pull up element is active.

17. The method of claim 14 wherein
the driver is coupled to a voltage supply and to a low voltage supply;
the driver includes an output terminal; and
each bit driver circuit includes an output element coupled between the output terminal and the voltage supply.

18. The method of claim 16 wherein
each output element includes a first transistor and a second transistor coupled in parallel, the first transistor having a first impedance and the second transistor having a second impedance, the first impedance changing in a direction opposite to the second impedance when the voltage changes.

19. The method of claim 17 wherein:
each bit driver circuit includes an inverter, the inverter receiving a control signal and providing an inverted control signal, the control signal and the inverted control signal being provided to the output element to control whether the output element is active or inactive.

20. The method of claim 14 wherein each of the plurality of bit pull up elements further includes a slew rate control circuit.

21. The method of claim 19 wherein the slew rate control circuit is coupled to the pull down circuit via a slew rate control current path.

22. The method of claim 9 firther comprising:
coupling the driver to a voltage supply and coupling the driver to a low voltage supply;
providing the driver with an output terminal; and
providing the pull down circuit with a base bit pull down circuit, the base bit pull down circuit including an output element coupled between the output terminal and the voltage supply.

23. The method of claim 21 wherein the output element includes a first transistor and a second transistor coupled in parallel, the first transistor having a first impedance and the second transistor having a second impedance, the first impedance changing in a direction opposite to the second impedance when an output voltage changes.

24. The method of claim 21 further comprising:
providing the pull down circuit with a pull down control circuit, the pull down control circuit receiving the input signal and receiving the pull down slew rate control current path from the pull up circuit and providing a control signal to the base bit pull down circuit, the control signal being related to the input signal.

25. The method of claim 23 further comprising:
providing the pull down circuit with a parallel bit pull down circuit, the parallel bit pull down circuit including a plurality of bit pull down elements and each of the plurality of bit pull down elements receiving a bit of a pull down control signal.

26. The method of claim 24 wherein each of the plurality of bit pull down elements includes a bit driver circuit and a bit control circuit coupled to the bit driver circuit, the bit control circuit determining whether the bit of the pull down control signal corresponding to the bit pull down element is active, the bit control circuit providing the bit driver circuit with the control signal when the bit of the pull down control signal is active.

27. The method of claim 25 wherein each of the plurality of bit pull down elements is responsive to the input signal if the bit of the pull down control signal corresponding to the bit pull down element is active.

28. The method of claim 25 wherein
the driver is coupled to a voltage supply and to a low voltage supply;
the driver includes an output terminal; and
each bit driver circuit includes an output element coupled between the output terminal and the voltage supply.

29. The method of claim 27 wherein
each output element includes a first transistor and a second transistor coupled in parallel, the first transistor having a first impedance and the second transistor having a second impedance, the first impedance changing in a direction opposite to the second impedance when the output voltage changes.

30. The method of claim 28 wherein:
each bit driver circuit includes an inverter, the inverter receiving a control signal and providing an inverted control signal, the control signal and the inverted control signal being provided to a transmission gate to control whether the output element is active or inactive.

31. The method of claim 25 wherein each of the plurality of bit pull down elements further includes a slew rate control circuit.

32. The method of claim 30 wherein the slew rate control circuit is coupled to the pull up circuit via a slew rate control current path.

33. A method of providing a driver with a slew rate controlled output signal, the method comprisng:

providing a pull up circuit having a first impedance;

coupling a pull down circuit to the pull up circuit, the pull down circuit having a second impedance;

providing a control signal to the pull up circuit and the pull down circuit, the control signal controlling at least one of a plurality of circuits in the pull down circuit and controlling at least one of a plurality of circuits in the pull up circuit, wherein:

the controlling of the at least one of the plurality of circuits in the pull down circuit provides slew rate control of the output signal for the pull up circuit by ensuring that an aggregate gate area that loads the output signal for the pull up circuit is the some regardless of which of the at least one of the plurality of circuits in the pull down circuit is enabled; and the controlling of the at least one of the plurality of circuits in the pull up circuit provides slew rate control of the output signal for the pull down circuit by ensuring that an aggregate gate area that loads the output signal for the pull down circuit is the same regardless of which of the at least one of the plurality of circuits in the pull up circuit is enabled.

\* \* \* \* \*